US011830555B2

(12) United States Patent
Masuduzzaman et al.

(10) Patent No.: US 11,830,555 B2
(45) Date of Patent: Nov. 28, 2023

(54) BIAS FOR DATA RETENTION IN FUSE ROM AND FLASH MEMORY

(71) Applicant: Western Digital Technologies, Inc., San Jose, CA (US)

(72) Inventors: Muhammad Masuduzzaman, Chandler, AZ (US); Deepanshu Dutta, Fremont, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 175 days.

(21) Appl. No.: 17/358,749

(22) Filed: Jun. 25, 2021

(65) Prior Publication Data

US 2022/0415402 A1 Dec. 29, 2022

(51) Int. Cl.
*G11C 11/34* (2006.01)
*G11C 16/10* (2006.01)
*G11C 16/26* (2006.01)
*G11C 16/30* (2006.01)
*G11C 16/34* (2006.01)
*G11C 16/08* (2006.01)

(52) U.S. Cl.
CPC ........... *G11C 16/102* (2013.01); *G11C 16/08* (2013.01); *G11C 16/26* (2013.01); *G11C 16/30* (2013.01); *G11C 16/3495* (2013.01)

(58) Field of Classification Search
CPC ......... G11C 16/10; G11C 16/30; G11C 16/12; G11C 16/0483

USPC .................................................... 365/185.18
See application file for complete search history.

(56) References Cited

U.S. PATENT DOCUMENTS

| | | | |
|---|---|---|---|
| 5,905,675 A | 5/1999 | Madurawe et al. | |
| 7,209,390 B2 | 4/2007 | Lue et al. | |
| 8,339,890 B2 | 12/2012 | Hsu et al. | |
| 8,437,193 B1 | 5/2013 | Yang | |
| 8,873,316 B2 | 10/2014 | Mu et al. | |
| 8,902,669 B2 | 12/2014 | Yang et al. | |
| 10,510,413 B1* | 12/2019 | Diep | G11C 16/3459 |
| 2011/0019495 A1* | 1/2011 | Scheuerlein | G11C 8/14 365/189.11 |
| 2015/0279462 A1* | 10/2015 | Iyer | G11C 14/0009 365/185.08 |

\* cited by examiner

*Primary Examiner* — Son T Dinh
(74) *Attorney, Agent, or Firm* — ARENTFOX SCHIFF LLP

(57) ABSTRACT

A storage device is provided that performs constant biasing in priority blocks, such as OTP memory blocks (fuse ROM) and flash memory blocks having a threshold number of P/E cycles. The storage device includes an OTP memory, a flash memory, and a controller. The OTP memory includes a block having a word line and a plurality of cells coupled to the word line. The flash memory includes another block having a word line and a plurality of cells coupled to this word line. The controller is configured to apply a constant bias to the word line of the OTP memory block and, in some cases to the word line of the flash memory block, between execution of host commands. As a result, lower bit error rates due to wider Vt margins may occur while system power may be saved through selective application of constant biasing.

20 Claims, 16 Drawing Sheets

BIAS FOR DATA RETENTION IN FUSE ROM AND FLASH MEMORY

BACKGROUND

Field

This disclosure is generally related to electronic devices and more particularly to storage devices.

Introduction

Storage devices enable users to store and retrieve data. Examples of storage devices include non-volatile memory devices. A non-volatile memory generally retains data after a power cycle. An example of a non-volatile memory is a flash memory, which may include array(s) of NAND cells on one or more dies. Flash memory may be found in solid-state devices (SSDs), Secure Digital (SD) cards, and the like.

A flash storage device may store control information associated with data. For example, a flash storage device may maintain control tables that include a mapping of logical addresses to physical addresses. This control tables are used to track the physical location of logical sectors, or blocks, in the flash memory. The control tables are stored in the non-volatile memory to enable access to the stored data after a power cycle.

Flash storage devices may program and read data in cells of a block of flash memory. However, between the times that a cell is programmed and read, electric charge stored in the cell may be lost. For example, electrons within a charge trapping layer (CTL) of the cell may migrate through a blocking oxide layer (BLK) or a tunnel oxide layer (TNL) of the cell, leading to cell charge loss. This charge loss may in turn result in bit errors when the flash storage device later attempts to read the cell, thereby impacting the data retention (DR) of the cell or block.

SUMMARY

One aspect of a storage device is disclosed herein. The storage device includes a one-time programmable (OTP) memory and a controller. The OTP memory includes a block having a word line and a plurality of cells coupled to the word line. The controller is configured to apply a constant bias to the word line between execution of host commands.

Another aspect of a storage device is disclosed herein. The storage device includes a fuse read-only memory (ROM) and a controller. The fuse ROM includes a block having a word line and a plurality of cells coupled to the word line. The controller is configured to receive host commands from a host device, and to apply a constant bias to the word line between execution of the host commands.

A further aspect of a storage device is disclosed herein. The storage device includes a OTP memory, a flash memory, and a controller. The OTP memory includes a first block having a first word line and a plurality of cells coupled to the first word line. The flash memory includes a second block having a second word line and a plurality of cells coupled to the second word line. The controller is configured to apply a first constant bias to the first word line and a second constant bias to the second word line between execution of host commands.

It is understood that other aspects of the storage device will become readily apparent to those skilled in the art from the following detailed description, wherein various aspects of apparatuses and methods are shown and described by way of illustration. As will be realized, these aspects may be implemented in other and different forms and its several details are capable of modification in various other respects. Accordingly, the drawings and detailed description are to be regarded as illustrative in nature and not as restrictive.

BRIEF DESCRIPTION OF THE DRAWINGS

Various aspects of the present invention will now be presented in the detailed description by way of example, and not by way of limitation, with reference to the accompanying drawings, wherein.

DETAILED DESCRIPTION

Figure 1:
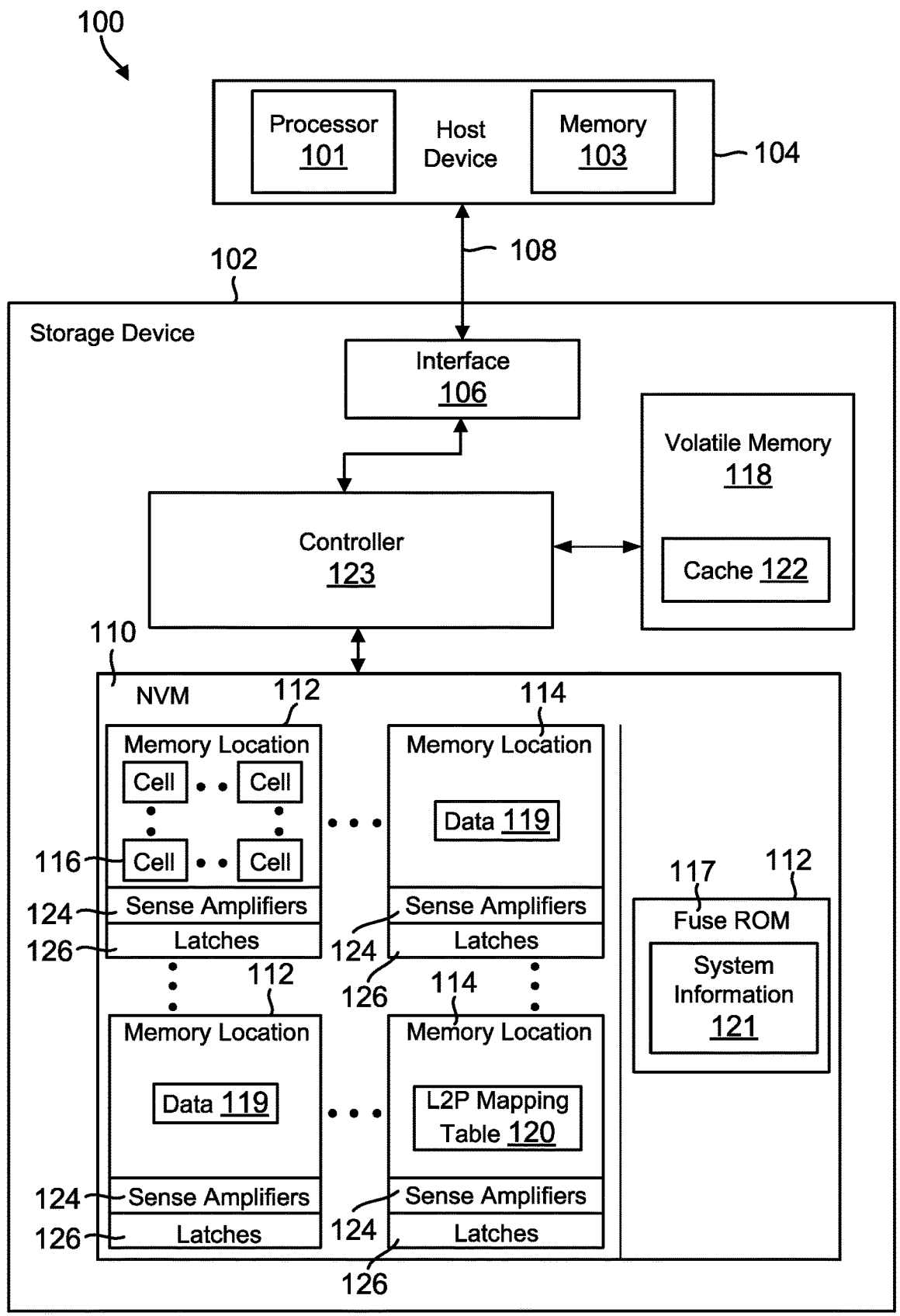
FIG. 1 is a block diagram illustrating an exemplary embodiment of a storage device in communication with a host device.

The detailed description set forth below in connection with the appended drawings is intended as a description of various exemplary embodiments of the present invention and is not intended to represent the only embodiments in which the present invention may be practiced. The detailed description includes specific details for the purpose of providing a thorough understanding of the present invention. However, it will be apparent to those skilled in the art that the present invention may be practiced without these specific details. In some instances, well-known structures and components are shown in block diagram form in order to avoid obscuring the concepts of the present invention. Acronyms and other descriptive terminology may be used merely for convenience and clarity and are not intended to limit the scope of the invention.

The words "exemplary" and "example" are used herein to mean serving as an example, instance, or illustration. Any exemplary embodiment described herein as "exemplary" is not necessarily to be construed as preferred or advantageous over other exemplary embodiments. Likewise, the term "exemplary embodiment" of an apparatus, method or article of manufacture does not require that all exemplary embodiments of the invention include the described components, structure, features, functionality, processes, advantages, benefits, or modes of operation.

As used herein, the term "coupled" is used to indicate either a direct connection between two components or, where appropriate, an indirect connection to one another through intervening or intermediate components. In contrast, when a component referred to as being "directly coupled" to another component, there are no intervening elements present.

In the following detailed description, various aspects of a storage device in communication with a host device will be presented. These aspects are well suited for flash storage devices, such as SSDs and SD cards. However, those skilled in the art will realize that these aspects may be extended to all types of storage devices capable of storing data. Accordingly, any reference to a specific apparatus or method is intended only to illustrate the various aspects of the present invention, with the understanding that such aspects may have a wide range of applications without departing from the spirit and scope of the present disclosure.

Flash storage devices may experience charge loss in cells and reduced DR. For example, electrons in the CTL of a cell may migrate through either the BLK or the TNL of the cell, thus reducing the voltage threshold (Vt) of the cell and in turn leading to read errors. Generally, cells with median Vts across a Vt distribution for a given program state (referred to here as median or majority cells), as well as cells with Vts at the upper tail end of the Vt distribution (referred to here as upper tail cells) experience charge loss through the BLK. As a result, if a positive bias or voltage is applied to a gate of a median or upper tail cell, the rate of charge loss may increase, leading to more Vt loss and reduced DR for that cell. In contrast, cells with Vts at the lower tail end of the Vt distribution (referred to here as lower tail cells) experience charge loss through the TNL, which is opposite in direction to the BLK. As a result, if a positive bias is applied to a gate of a lower tail cell, the rate of charge loss may decrease, leading to less Vt loss and increased or maintained DR for that cell. Therefore, when a positive bias is applied to lower tail, median, and upper tail cells of a block at the same time (e.g., on a same word line), the Vt distribution of the cells sharing a given program state may narrow or tighten due to the difference in Vt changes between the cells. Similarly, other Vt distributions for other program states may also narrow, resulting in larger or increased Vt margins between different program states. For instance, applying a constant, 4 V bias to cells on a word line between execution of host commands may result in an increased Vt margin of approximately 400 mV (or in other words, Vt distributions in adjacent program states may be separated by an additional 400 mV). As a result of the increased margin, less or no Vt overlap between program states may result, resulting in fewer bit errors.

Thus, constantly applying a bias to word lines of various blocks may improve the DR of the cells through increased Vt margin between the Vt distributions of different program states. Moreover, constant biasing may provide greater DR benefit than periodic or pulse biasing (e.g., refresh reads) due to higher Vt margin increases. However, this constant application of voltage may inefficiently lead to increased power consumption. For instance, constantly applying a positive bias to word lines of numerous blocks between host commands (e.g., while the flash storage device is not programming or reading data) may result in higher currents (e.g., Icc) and consume significant power of the flash storage device.

Therefore, to save system power while maintaining the benefit of DR from constant biasing, the flash storage device of the present disclosure may apply constant biasing between host commands to specific blocks where DR or reliability may be a priority, such as blocks storing system information in OTP memory (e.g., fuse ROM blocks) or aged blocks storing data in flash memory (as opposed to every block unconditionally). For instance, after a controller of the flash storage device programs data in one of these blocks, the controller may apply a constant bias to the cell gates or word lines in this block until the controller later reads data from the block. By limiting application of constant biasing in such manner, Vt margins may be improved for priority blocks without significant cost in power.

In one example, the controller may apply the constant bias to word lines in block(s) of fuse ROM or other OTP memory. OTP memories are only programmable once, and thus cannot be erased and re-programmed in contrast to flash memories. Moreover, OTP memories typically store system information to run the flash storage device (e.g., file system information, etc.). Therefore, if charge loss occurs in an OTP memory cell resulting in bit errors due to Vt overlap between program states (insufficient margins), the cell may not be re-programmed to compensate for the loss, causing the OTP memory to become irreparable. Accordingly, to minimize this risk, the controller may constantly bias OTP memory block(s) to prevent the charge loss and achieve the aforementioned benefit of improved Vt margins and DR. Moreover, the storage device may save the power costs incurred by such constant biasing, in this example, by limiting the biasing to these OTP memory block(s) without applying bias to the flash memory blocks.

In another example, in addition to constantly biasing OTP memory block(s), the controller may further apply a constant bias to word lines in cycled blocks of flash memory, while refraining from applying the constant bias to word lines in fresh blocks of flash memory. Here, a "fresh" block is a block having a number of program/erase (P/E) cycles less than a given age threshold (e.g., 1K or some other number), while a "cycled" block is a block having a number of P/E cycles greater than or equal to the given age threshold. For instance, when the controller is not currently executing a host command, the flash storage device may apply a constant voltage to word lines of a flash memory block having at least 1000 P/E cycles, but may not apply the constant voltage to word lines of a flash memory block having less than 1000 P/E cycles. This approach may efficiently save power since the Vt margin increase resulting from constant application of a positive bias on the word line may generally be insignificant for fresh blocks but significant for cycled blocks.

In a further example, the constant bias applied to the word lines of a flash memory block may be a function of the number of P/E cycles of the block. For instance, the flash storage device may apply one constant bias (e.g., 4 V) to word lines of a flash memory block having 1000 P/E cycles and a different constant bias (e.g., 4.25 V) to word lines of a flash memory block having 2000 P/E cycles. As blocks with higher P/E cycles may experience more charge loss than blocks with lower P/E cycles, the different biases may provide corresponding Vt margin improvements to compensate for the different charge losses. For instance, a higher bias may sufficiently compensate the charge loss in a higher cycled block while a lower bias may sufficiently compensate the charge loss in a lowered cycled block. Thus, the controller may efficiently save power by controlling the amount of voltage the controller may constantly apply to a word line in a block in response to the number of P/E cycles of that block.

In an additional example, the constant bias which the controller may apply to a word line in either (or both) the OTP memory block(s) or the cycled flash memory block(s) may be a driven bias or a floating bias. For instance, either or both the OTP memory or flash memory may include a charging circuit, including a voltage source or a charge pump and one or more switches, transistors, or other electrical components connecting the voltage source or charge pump to the word lines, with which the controller may drive or float a constant bias to the word lines. While a driven bias may provide more DR improvement than a floating bias due to constant cell charging, a floating bias may save more power than a driven bias by interrupting the flow of charging current. Thus, OTP memory block(s) and cycled flash memory block(s) may balance DR improvement with power by incorporating driven and floating biases (e.g., a driven bias for one word line of a block, and a floating bias for a different word line of the block). Alternatively, only driven biases or floating biases may be implemented for more simplistic design.

In one example, to apply a driven bias, the controller may enable a charging circuit (e.g., by turning on a switch) to drive the voltage output by a source or charge pump to a selected word line. The controller may continuously allow current to flow from the source or charge pump to the word line (e.g., by not turning off the switch), and thus constantly maintain the driven bias, until the controller later executes a host command. To apply a floating bias, the controller may similarly enable the charging circuit (e.g., by turning on the switch) to drive the voltage output by the source of charge pump to the selected word line, but afterwards disable the charging circuit (e.g., by turning off the switch) to float the bias on the word line. Thus, the controller may save more power with floating biases than driven biases. However, while disabling the charging circuit to apply a floating bias may prevent the flow of charging current from the voltage supply along the word line, a leakage current through the cells may still be present which reduces the floating bias over time. Accordingly, to compensate for this leakage current, the controller may re-enable the charging circuit (e.g., by again turning on the switch coupled to the word line) to re-charge the cells, thus refreshing the bias on the word line. The controller may then re-disable the charging circuit to again float the refreshed bias. This floating bias refresh procedure may occur periodically based on a page size (or the number of cells coupled to a word line) of the OTP memory or flash memory. For instance, the controller may re-charge the cells on a word line associated with an 8K page a shorter period of time after floating the word line, while the controller may re-charge the cells on another word line associated with a 16K page a longer period of time after floating that word line.

Figure 14:
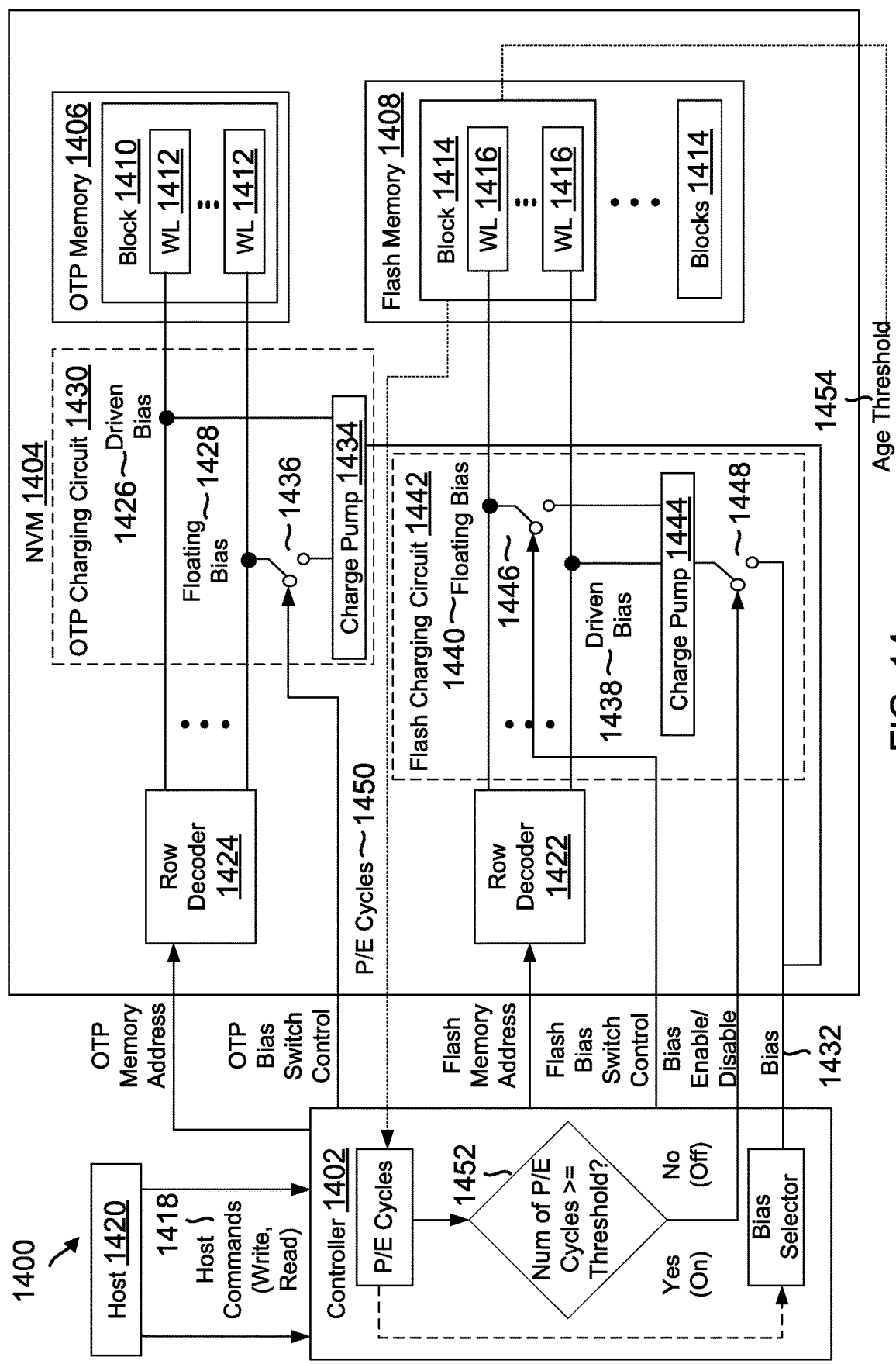
FIG. 14 is a conceptual diagram illustrating an example of constant biasing performed by a controller in the storage device of FIG. 1.

While the above and below description refer to specific examples of how a controller may apply constant biasing (e.g., using a charging circuit, controller outputs, memories, and other elements illustrated in FIG. 14), the scope of the present disclosure is not so limited. For example, different circuit(s), electrical component(s), component arrangement(s), circuit input(s)/output(s), controller input(s)/output(s), and the like, other than those described or illustrated in this disclosure, may be implemented in the flash storage device in other examples for the controller to apply active constant biasing (driven biases) or passive constant biasing (floating biases). Similarly, while the above and below description refer to a specific example of how a controller may conditionally apply constant biasing based on a number of P/E cycles (such as illustrated in FIG. 14), the scope of the present disclosure is similarly not so limited. For example, different circuit(s), electrical component(s), component arrangement(s), circuit input(s)/output(s), controller input (s)/output(s), and the like, other than those described or illustrated in this disclosure, may be implemented in the flash storage device in other examples for the controller to apply constant biasing to cycled blocks in flash memory (as opposed to fresh blocks), or only to block(s) in OTP memory.

FIG. 1 shows an exemplary block diagram 100 of a storage device 102 which communicates with a host device 104 (also "host") according to an exemplary embodiment. The host 104 and the storage device 102 may form a system, such as a computer system (e.g., server, desktop, mobile/laptop, tablet, smartphone, etc.). The components of FIG. 1 may or may not be physically co-located. In this regard, the host 104 may be located remotely from storage device 102. Although FIG. 1 illustrates that the host 104 is shown separate from the storage device 102, the host 104 in other embodiments may be integrated into the storage device 102, in whole or in part. Alternatively, the host 104 may be distributed across multiple remote entities, in its entirety, or alternatively with some functionality in the storage device 102.

Those of ordinary skill in the art will appreciate that other exemplary embodiments can include more or less than those elements shown in FIG. 1 and that the disclosed processes can be implemented in other environments. For example, other exemplary embodiments can include a different number of hosts communicating with the storage device 102, or multiple storage devices 102 communicating with the host(s).

The host device 104 may store data to, and/or retrieve data from, the storage device 102. The host device 104 may include any computing device, including, for example, a computer server, a network attached storage (NAS) unit, a desktop computer, a notebook (e.g., laptop) computer, a tablet computer, a mobile computing device such as a smartphone, a television, a camera, a display device, a digital media player, a video gaming console, a video streaming device, or the like. The host device 104 may include at least one processor 101 and a host memory 103. The at least one processor 101 may include any form of hardware capable of processing data and may include a general purpose processing unit (such as a central processing unit (CPU)), dedicated hardware (such as an application specific integrated circuit (ASIC)), digital signal processor (DSP), configurable hardware (such as a field programmable gate array (FPGA)), or any other form of processing unit configured by way of software instructions, firmware, or the like. The host memory 103 may be used by the host device 104 to store data or instructions processed by the host or data received from the storage device 102. In some examples, the host memory 103 may include non-volatile memory, such as magnetic memory devices, optical memory devices, holographic memory devices, flash memory devices (e.g., NAND or NOR), phase-change memory (PCM) devices, resistive random-access memory (ReRAM) devices, magnetoresistive random-access memory (MRAM) devices, ferroelectric random-access memory (F-RAM), and any other type of non-volatile memory devices. In other examples, the host memory 103 may include volatile memory, such as random-access memory (RAM), dynamic random access memory (DRAM), static RAM (SRAM), and synchronous dynamic RAM (SDRAM (e.g., DDR1, DDR2, DDR3, DDR3L, LPDDR3, DDR4, and the like). The host memory 103 may also include both non-volatile memory and volatile memory, whether integrated together or as discrete units.

The host interface 106 is configured to interface the storage device 102 with the host 104 via a bus/network 108, and may interface using, for example, Ethernet or WiFi, or a bus standard such as Serial Advanced Technology Attachment (SATA), PCI express (PCIe), Small Computer System Interface (SCSI), or Serial Attached SCSI (SAS), among other possible candidates. Alternatively, the host interface 106 may be wireless, and may interface the storage device 102 with the host 104 using, for example, cellular communication (e.g. 5G NR, 4G LTE, 3G, 2G, GSM/UMTS, CDMA One/CDMA2000, etc.), wireless distribution methods through access points (e.g. IEEE 802.11, WiFi, HiperLAN, etc.), Infra Red (IR), Bluetooth, Zigbee, or other Wireless Wide Area Network (WWAN), Wireless Local Area Network (WLAN), Wireless Personal Area Network (WPAN) technology, or comparable wide area, local area, and personal area technologies.

The storage device 102 includes a memory. For example, in the exemplary embodiment of FIG. 1, the storage device 102 may include a non-volatile memory (NVM) 110 for persistent storage of data received from the host 104. The NVM 110 can include, for example, flash integrated circuits, NAND memory (e.g., single-level cell (SLC) memory, multi-level cell (MLC) memory, triple-level cell (TLC) memory, quad-level cell (QLC) memory, penta-level cell (PLC) memory, or any combination thereof), or NOR memory. In addition to flash memory, the NVM 110 can also include OTP memory, such as a fuse read-only memory (ROM). The NVM 110 may include a plurality of memory locations 112 which may store system data for operating the storage device 102 or user data received from the host for storage in the storage device 102. For example, the NVM may have a cross-point architecture including a 2-D NAND array of memory locations 112 having n rows and m columns, where m and n are predefined according to the size of the NVM. In the exemplary embodiment of FIG. 1, each memory location 112 may be a die 114 including multiple planes each including multiple blocks of multiple cells 116. Alternatively, each memory location 112 may be a plane including multiple blocks of the cells 116. The cells 116 may be single-level cells, multi-level cells, triple-level cells, quad-level cells, and/or penta-level cells, for example. Other examples of memory locations 112 are possible; for instance, each memory location may be a block or group of blocks. Each memory location may include one or more blocks in a 3-D NAND array. Each memory location 112 may include one or more logical blocks which are mapped to one or more physical blocks. One or more of the memory locations 112 may be a fuse ROM 117 or other OTP memory. Alternatively, the memory and each memory location may be implemented in other ways known to those skilled in the art.

The storage device 102 also includes a volatile memory 118 that can, for example, include a Dynamic Random Access Memory (DRAM) or a Static Random Access Memory (SRAM). Data stored in volatile memory 118 can include data read from the NVM 110 or data to be written to the NVM 110. In this regard, the volatile memory 118 can include a write buffer or a read buffer for temporarily storing data. While FIG. 1 illustrates the volatile memory 118 as being remote from a controller 123 of the storage device 102, the volatile memory 118 may be integrated into the controller 123.

The memory (e.g. NVM 110) is configured to store data 119 received from the host device 104. The data 119 may be stored in the cells 116 of any of the memory locations 112. As an example, FIG. 1 illustrates data 119 being stored in different memory locations 112, although the data may be stored in the same memory location. In another example, the memory locations 112 may be different dies, and the data may be stored in one or more of the different dies. Moreover, one or more of the memory locations 112 (e.g., fuse ROM 117) may be configured to store system information 121, such as file system data or other control information for operating the storage device 102 (which may be programmed only once).

Each of the data 119 may be associated with a logical address. For example, the NVM 110 may store a logical-to-physical (L2P) mapping table 120 for the storage device 102 associating each data 119 with a logical address. The L2P mapping table 120 stores the mapping of logical addresses specified for data written from the host 104 to physical addresses in the NVM 110 indicating the location(s) where each of the data is stored. This mapping may be performed by the controller 123 of the storage device. The L2P mapping table may be a table or other data structure which includes an identifier such as a logical block address (LBA) associated with each memory location 112 in the NVM where data is stored. While FIG. 1 illustrates a single L2P mapping table 120 stored in one of the memory locations 112 of NVM to avoid unduly obscuring the concepts of FIG. 1, the L2P mapping table 120 in fact may include multiple tables stored in one or more memory locations of NVM.

Figure 2:
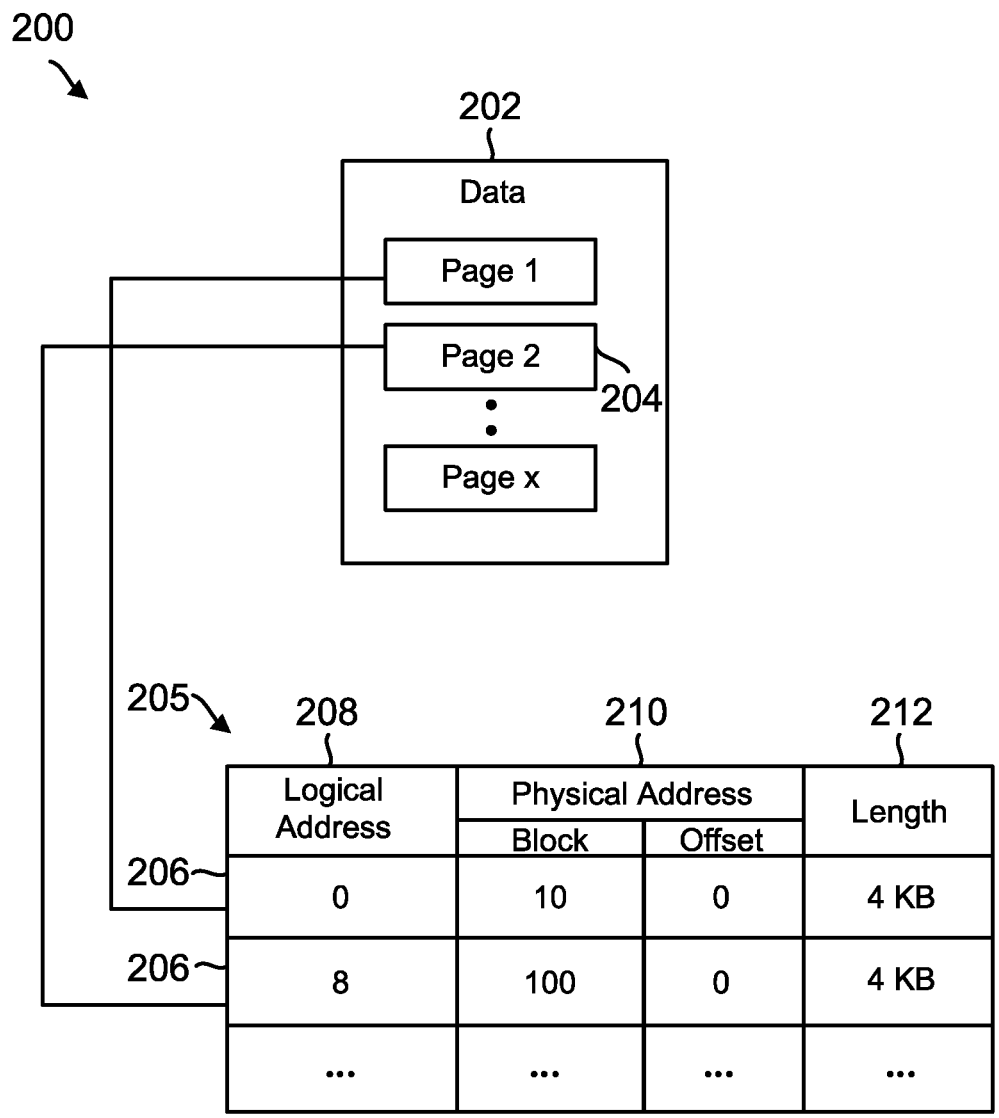
FIG. 2 is a conceptual diagram illustrating an example of a logical-to-physical mapping table in a non-volatile memory of the storage device of FIG. 1.

FIG. 2 is a conceptual diagram 200 of an example of an L2P mapping table 205 illustrating the mapping of data 202 received from a host device to logical addresses and physical addresses in the NVM 110 of FIG. 1. The data 202 may correspond to the data 119 in FIG. 1, while the L2P mapping table 205 may correspond to the L2P mapping table 120 in FIG. 1. In one exemplary embodiment, the data 202 may be stored in one or more pages 204, e.g., pages 1 to x, where x is the total number of pages of data being written to the NVM 110. Each page 204 may be associated with one or more entries 206 of the L2P mapping table 205 identifying a logical block address (LBA) 208, a physical address 210 associated with the data written to the NVM, and a length 212 of the data. LBA 208 may be a logical address specified in a write command for the data received from the host device. Physical address 210 may indicate the block and the offset at which the data associated with LBA 208 is physically written. Length 212 may indicate a size of the written data (e.g. 4 KB or some other size).

Referring back to FIG. 1, the volatile memory 118 also stores a cache 122 for the storage device 102. The cache 122 includes entries showing the mapping of logical addresses specified for data requested by the host 104 to physical addresses in NVM 110 indicating the location(s) where the data is stored. This mapping may be performed by the controller 123. When the controller 123 receives a read command or a write command for data 119, the controller checks the cache 122 for the logical-to-physical mapping of each data. If a mapping is not present (e.g. it is the first request for the data), the controller accesses the L2P mapping table 120 and stores the mapping in the cache 122. When the controller 123 executes the read command or write command, the controller accesses the mapping from the cache and reads the data from or writes the data to the NVM 110 at the specified physical address. The cache may be stored in the form of a table or other data structure which includes a logical address associated with each memory location 112 in NVM where data is being read.

The NVM 110 includes sense amplifiers 124 and data latches 126 connected to each memory location 112. For example, the memory location 112 may be a block including cells 116 on multiple bit lines, and the NVM 110 may include a sense amplifier 124 on each bit line. Moreover, one or more data latches 126 may be connected to the bit lines and/or sense amplifiers. The data latches may be, for example, shift registers. When data is read from the cells 116 of the memory location 112, the sense amplifiers 124 sense the data by amplifying the voltages on the bit lines to a logic level (e.g. readable as a '0' or a '1'), and the sensed data is stored in the data latches 126. The data is then transferred from the data latches 126 to the controller 123, after which the data is stored in the volatile memory 118 until it is transferred to the host device 104. When data is written to the cells 116 of the memory location 112, the controller 123 stores the programmed data in the data latches 126, and the data is subsequently transferred from the data latches 126 to the cells 116.

The storage device 102 includes a controller 123 which includes circuitry such as one or more processors for executing instructions and can include a microcontroller, a Digital Signal Processor (DSP), an Application-Specific Integrated Circuit (ASIC), a Field Programmable Gate Array (FPGA), hard-wired logic, analog circuitry and/or a combination thereof.

The controller 123 is configured to receive data transferred from one or more of the cells 116 of the various memory locations 112 in response to a read command. For example, the controller 123 may read the data 119 by activating the sense amplifiers 124 to sense the data from cells 116 into data latches 126, and the controller 123 may receive the data from the data latches 126. The controller 123 is also configured to program data into one or more of the cells 116 in response to a write command. For example, the controller 123 may write the data 119 by sending data to the data latches 126 to be programmed into the cells 116. The controller 123 is further configured to access the L2P mapping table 120 in the NVM 110 when reading or writing data to the cells 116. For example, the controller 123 may receive logical-to-physical address mappings from the NVM 110 in response to read or write commands from the host device 104, identify the physical addresses mapped to the logical addresses identified in the commands (e.g. translate the logical addresses into physical addresses), and access or store data in the cells 116 located at the mapped physical addresses.

The controller 123 and its components may be implemented with embedded software that performs the various functions of the controller described throughout this disclosure. Alternatively, software for implementing each of the aforementioned functions and components may be stored in the NVM 110 or in a memory external to the storage device 102 or host device 104, and may be accessed by the controller 123 for execution by the one or more processors of the controller 123. Alternatively, the functions and components of the controller may be implemented with hardware in the controller 123, or may be implemented using a combination of the aforementioned hardware and software.

In operation, the host device 104 stores data in the storage device 102 by sending a write command to the storage device 102 specifying one or more logical addresses (e.g., LBAs) as well as a length of the data to be written. The interface element 106 receives the write command, and the controller allocates a memory location 112 in the NVM 110 of storage device 102 for storing the data. The controller 123 stores the L2P mapping in the NVM (and the cache 122) to map a logical address associated with the data to the physical address of the memory location 112 allocated for the data. The controller also stores the length of the L2P mapped data. The controller 123 then stores the data in the memory location 112 by sending it to one or more data latches 126 connected to the allocated memory location, from which the data is programmed to the cells 116.

The host 104 may retrieve data from the storage device 102 by sending a read command specifying one or more logical addresses associated with the data to be retrieved from the storage device 102, as well as a length of the data to be read. The interface 106 receives the read command, and the controller 123 accesses the L2P mapping in the cache 122 or otherwise the NVM to translate the logical addresses specified in the read command to the physical addresses indicating the location of the data. The controller 123 then reads the requested data from the memory location 112 specified by the physical addresses by sensing the data using the sense amplifiers 124 and storing them in data latches 126 until the read data is returned to the host 104 via the host interface 106.

Figure 3:
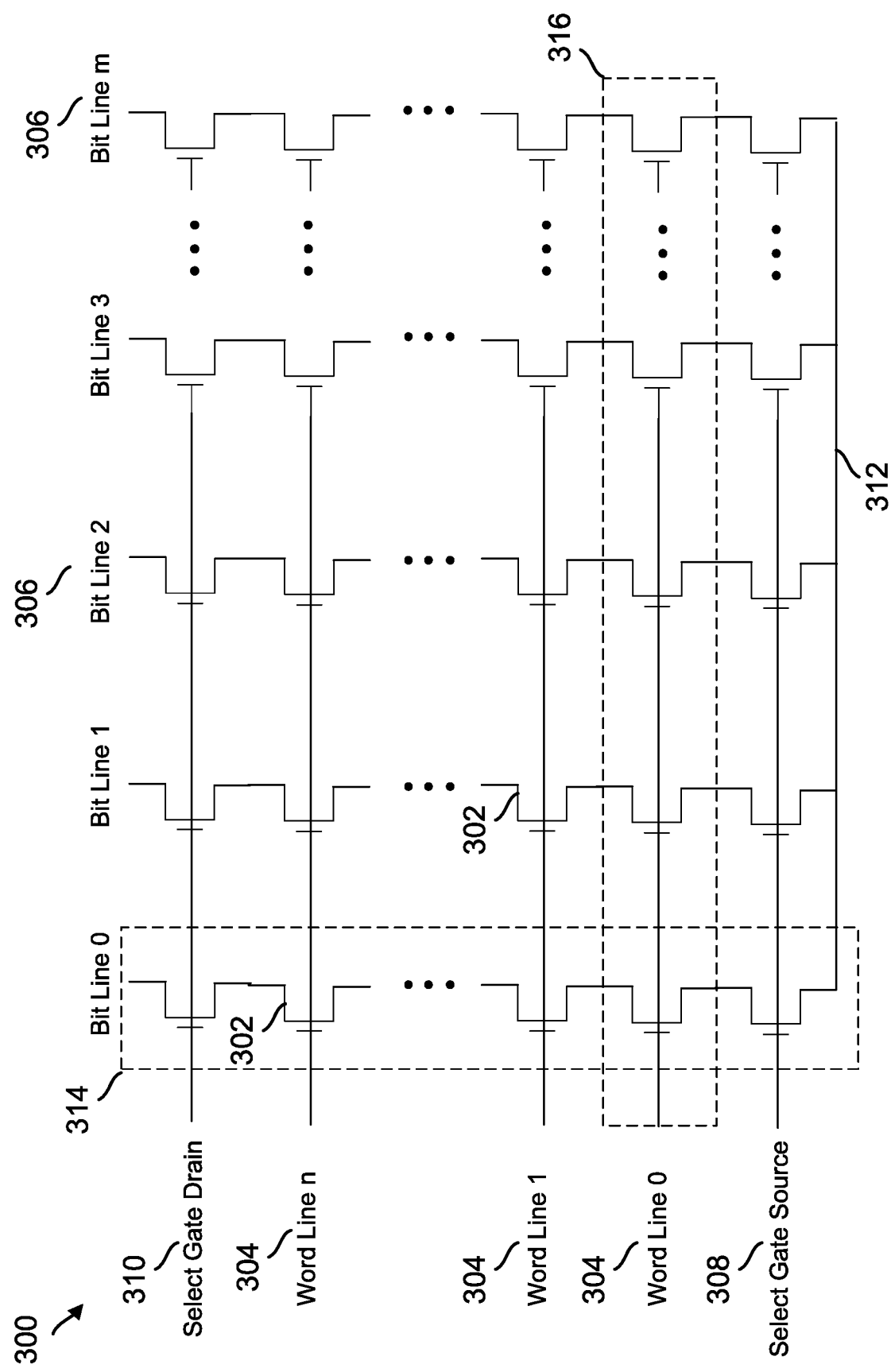
FIG. 3 is a conceptual diagram illustrating an example of an array of memory cells in the storage device of FIG. 1.

FIG. 3 illustrates an example of a NAND memory array 300 of cells 302. Cells 302 may correspond to cells 116 in the NVM 110 of FIG. 1. Multiple cells 302 are coupled to word lines 304 and bit lines 306. For example, the memory array 300 may include n word lines and m bit lines within a block of a die 114 of the NVM 110, where n and m are predefined according to the size of the block. Each word line and bit line may be respectively associated with a row and column address, which the controller 123 may use to select particular word lines and bit lines (e.g. using a row and column decoder). For example, word lines 0-n may each be associated with their own row address (e.g. word line 0 may correspond to word line address 0, word line 1 may correspond to word line address 1, etc.), and bit lines 0-m may each be associated with their own column address (e.g. bit line 0 may correspond to bit line address 0, bit line 1 may correspond to bit line address 1, etc.). Select gate source (SGS) cells 308 and select gate drain (SGD) cells 310 are coupled to the memory cells 302 on each bit line 306. The SGS cells 308 and SGD cells 310 connect the memory cells 302 to a source line 312 (e.g. ground) and bit lines 306, respectively. A string 314 may include a group of cells 302 (including SGS and SGD cells 308, 310) coupled to one bit line within a block, while a page 316 may include a group of cells 302 coupled to one word line within the block.

Figure 4:
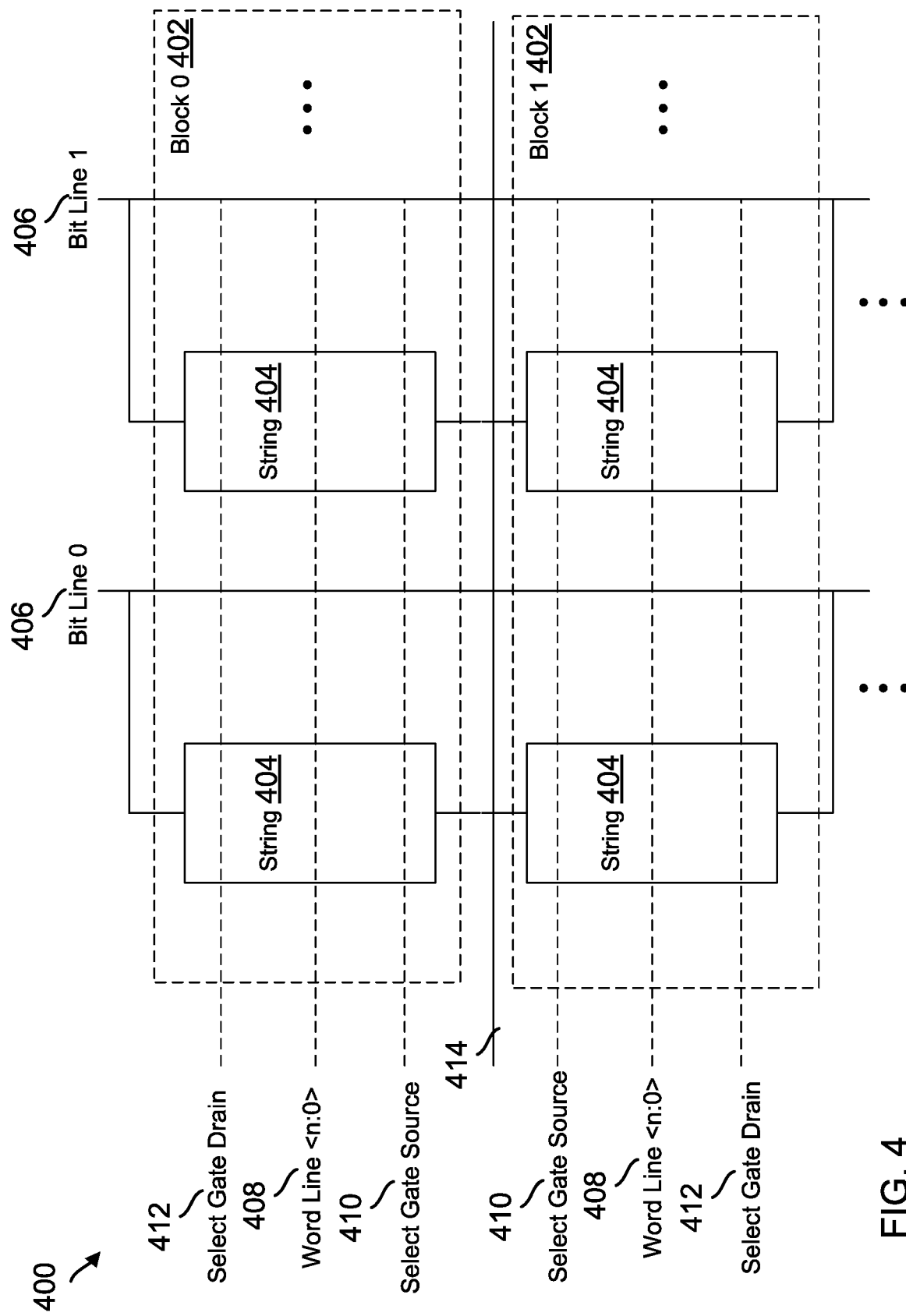
FIG. 4 is a conceptual diagram illustrating an example of an array of blocks in the storage device of FIG. 1.

FIG. 4 illustrates an example of a NAND memory array 400 of blocks 402 including multiple strings 404. Blocks 402 may correspond to blocks of a die 114 in the NVM 110 of FIG. 1, and strings 404 may each correspond to string 314 in FIG. 3. As in the memory array 300 of FIG. 3, each string 404 may include a group of memory cells each coupled to a bit line 406 and individually coupled to respective word lines 408. Similarly, each string may include a SGS cell 410 and SGD cell 412 which respectively connects the memory cells in each string 404 to a source line 414 and bit line 406.

When the controller 123 reads data from or writes data to a page 316 of cells 302 (i.e. on a word line 304, 408), the controller may send a command to apply a read voltage or program voltage to the selected word line and a pass through voltage to the other word lines. The read or programmed state of the cell (e.g. a logic '0' or a logic '1' for SLCs) may then be determined based on a threshold voltage of the cells 302. For example, during an SLC read operation, if the threshold voltage of a cell 302 is smaller than the read voltage (i.e. current flows through the cell in response to the read voltage), the controller 123 may determine that the cell stores a logic '1', while if the threshold voltage of the cell 302 is larger than the read voltage (i.e. current does not flow through the cell in response the read voltage), the controller 123 may determine that the cell stores a logic '0'. Similarly, during an SLC program operation, the controller may store a logic '0' by sending a command to apply the program voltage to the cell 302 on the word line 304, 408 until the cell reaches the threshold voltage, and during an erase operation, the controller may send a command to apply an erase voltage to the block 402 including the cells 302 (e.g. to a substrate of the cells such as a p-well) until the cells reduce back below the threshold voltage (back to logic '1').

For cells that store multiple bits (e.g. MLCs, TLCs, etc.), each word line 304, 408 may include multiple pages 316 of cells 302, and the controller may similarly send commands to apply read or program voltages to the word lines to determine the read or programmed state of the cells based on a threshold voltage of the cells. For instance, in the case of TLCs, each word line 304, 408 may include three pages 316, including a lower page (LP), a middle page (MP), and an upper page (UP), respectively corresponding to the different bits stored in the TLC. In one example, when programming TLCs, the LP may be programmed first, followed by the MP and then the UP. For example, a program voltage may be applied to the cell on the word line 304, 408 until the cell reaches a first intermediate threshold voltage corresponding to a least significant bit (LSB) of the cell. Next, the LP may be read to determine the first intermediate threshold voltage, and then a program voltage may be applied to the cell on the word line until the cell reaches a second intermediate threshold voltage corresponding to a next bit of the cell (between the LSB and the most significant bit (MSB)). Finally, the MP may be read to determine the second intermediate threshold voltage, and then a program voltage may be applied to the cell on the word line until the cell reaches the final threshold voltage corresponding to the MSB of the cell. Alternatively, in other examples, the LP, MP, and UP may be programmed together (e.g., in full sequence programming or Foggy-Fine programming), or the LP and MP may be programmed first, followed by the UP (e.g., LM-Foggy-Fine programming). Similarly, when reading TLCs, the controller 123 may read the LP to determine whether the LSB stores a logic 0 or 1 depending on the threshold voltage of the cell, the MP to determine whether the next bit stores a logic 0 or 1 depending on the threshold voltage of the cell, and the UP to determine whether the final bit stores a logic 0 or 1 depending on the threshold voltage of the cell.

Figure 5:
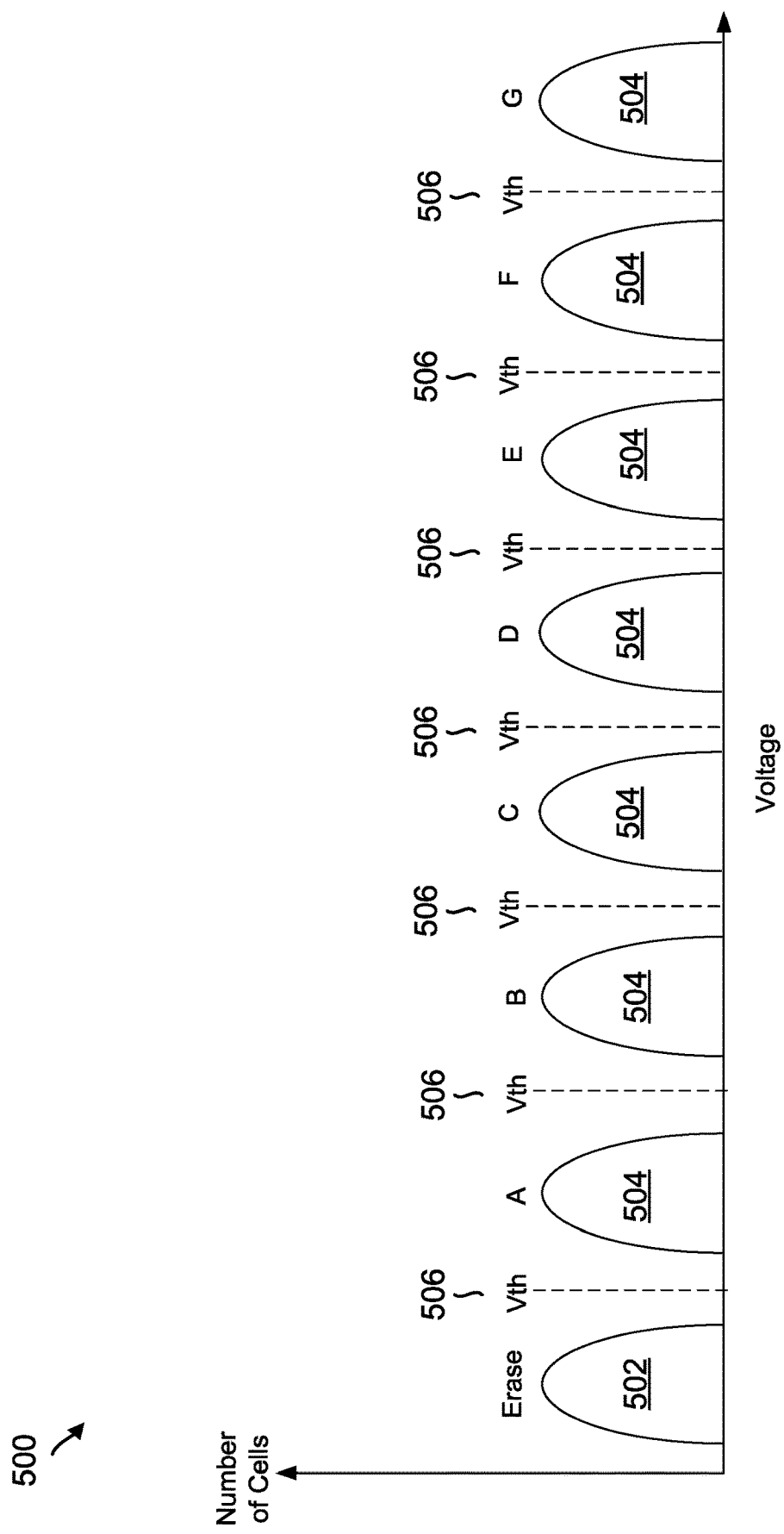
FIG. 5 is a graphical diagram illustrating an example of a voltage distribution chart for triple-level cells in the storage device of FIG. 1.

FIG. 5 illustrates an example of a voltage distribution chart 500 illustrating different NAND states for TLCs (e.g. cells 116, 302) storing three bits of data (e.g. logic 000, 001, etc. up to logic 111). The TLCs may include an erase state 502 corresponding to logic '111' and multiple program states 504 (e.g. A-G) corresponding to other logic values '000-110'. The program states 504 may be separated by different threshold voltages 506. Initially, the cells 116, 302 may be in the erase state 502, e.g. after the controller 123 erases a block 402 including the cells. When the controller 123 program LPs, MPs, and UPs as described above, the voltages of the cells 116, 302 may be increased until the threshold voltages 506 corresponding to the logic values to be stored are met, at which point the cells transition to their respective program states 504. While FIG. 5 illustrates eight NAND states for TLCs, the number of states may be different depending on the amount of data that is stored in each cell 116, 302. For example, SLCs may have two states (e.g. logic 0 and logic 1), MLCs may have four states (e.g. logic 00, 01, 10, 11), and QLCs may have sixteen states (e.g. erase and A-N).

Figure 6A:
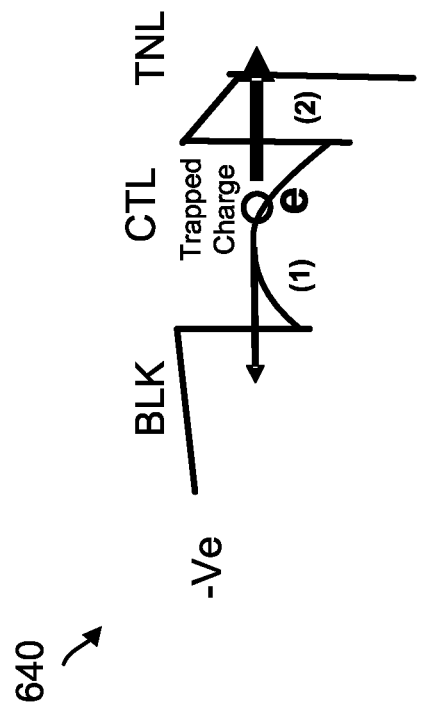
FIGS. 6A-6C are conceptual diagrams illustrating examples of charge loss in a cell in a neutral state, with an applied positive bias, and with an applied negative bias, respectively.

Over time, cells 116, 302 may experience charge loss, and thus reduction of threshold voltages 506, due to migration or de-trapping of electrons from the charge trapping layer (CTL) of the cells. The migration may occur in the direction of a blocking oxide layer (BLK) of a cell or in the direction of a tunnel oxide layer (TNL) of a cell. For instance, FIG. 6A illustrates an example 600 of charge that may leave the CTL either in direction (1) through the BLK or in direction (2) through the TNL when the cells are in a neutral state (without an applied bias). Moreover, the rate of charge migration may accelerate or decelerate in a given direction (BLK or TNL) depending on whether a positive or negative bias is applied to the cells. For example, if a positive bias is applied to the gate of the cells, direction (1) may be dominant, while if a negative bias is applied to the gate of the cells, direction (2) may be dominant for these cells. For instance, FIG. 6B illustrates an example 620 of charge that migrates from the CTL through the BLK predominantly in direction (1) in response to an applied positive bias Ve, while FIG. 6C illustrates an example 640 of charge that migrates from the CTL through the TNL predominantly in direction (2) in response to an applied negative bias −Ve.

Figure 6B:
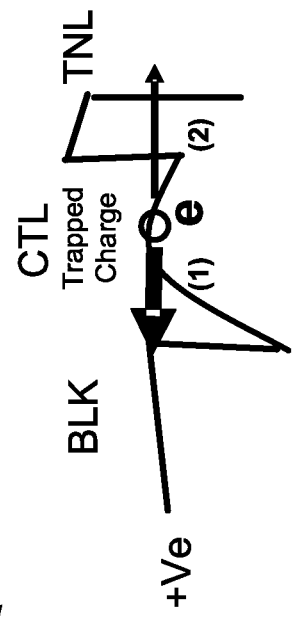
Figure 6C:
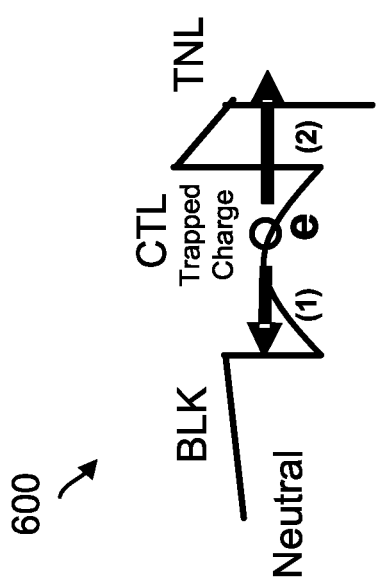
Figure 7:
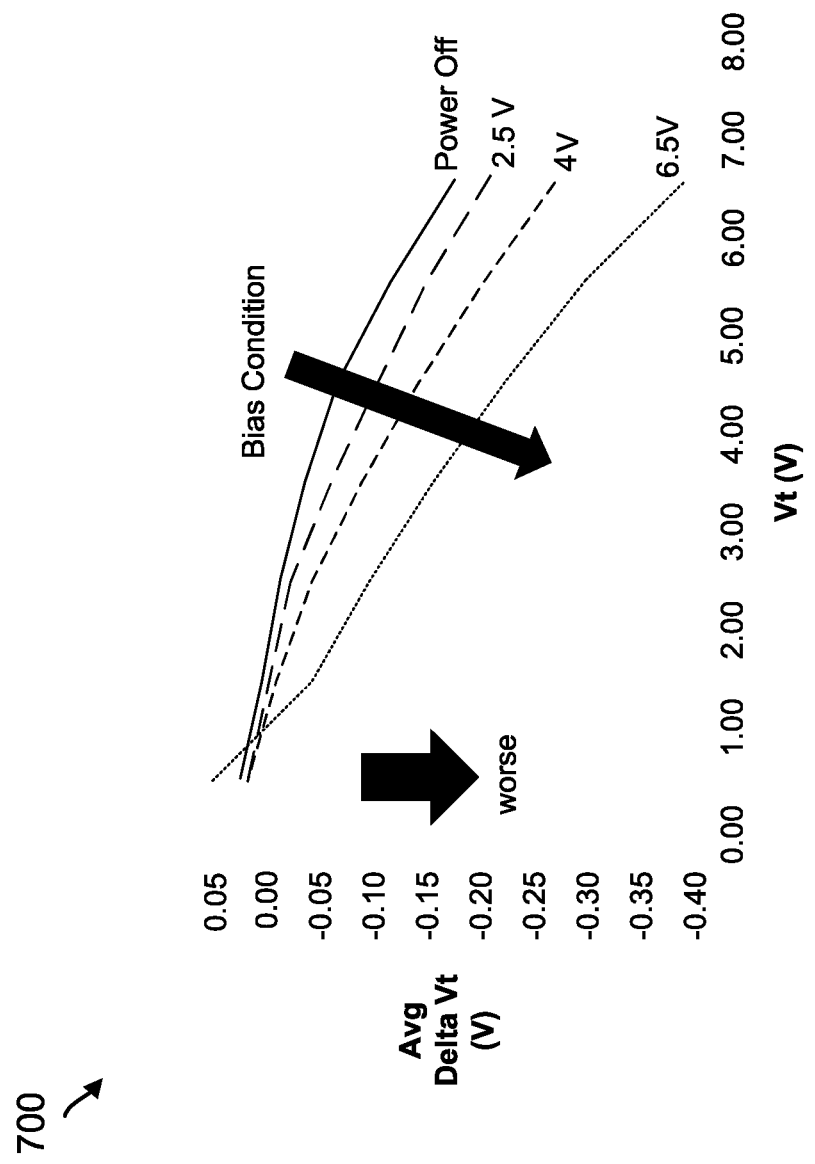
FIG. 7 is a graphical diagram illustrating examples of average drops in cell voltage thresholds in response to different positive biases applied to the cells.

FIG. 7 depicts a graph 700 showing examples of average drops in cell voltage thresholds (e.g., the threshold voltages 506 of FIG. 5) in response to different positive biases applied to the cells (e.g., Ve in FIG. 6B). For instance, the average change (delta) in Vt in the various cells monotonously decreases from the neutral state across the Vts for different positive bias conditions (e.g., 2.5 V bias, 4 V bias, and 6.5 V bias). The illustrated results corroborate the expectation that median cells may discharge through direction (1) in response to an applied positive bias, as referenced in FIG. 6B.

Figure 8:
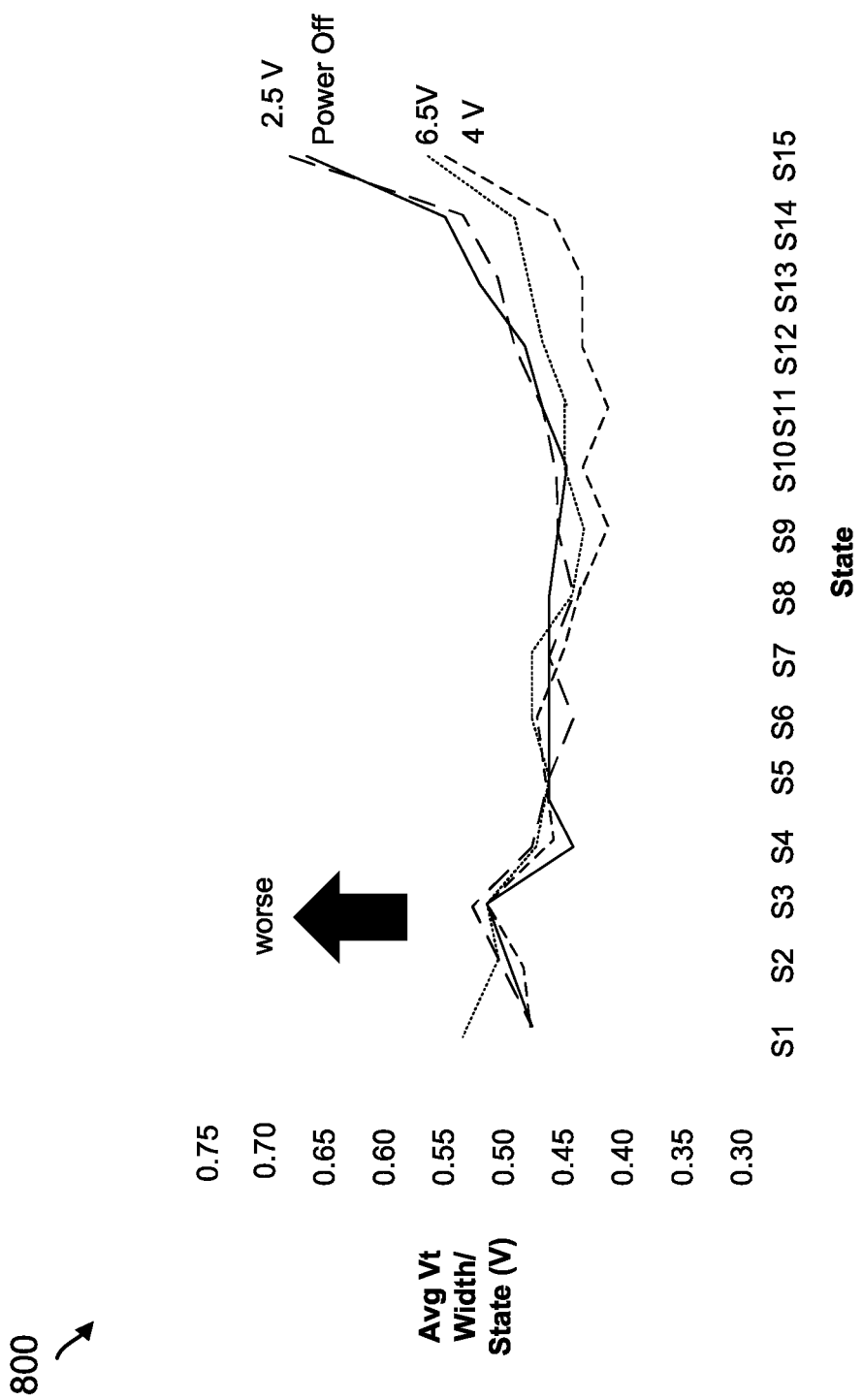
FIG. 8 is a graphical diagram illustrating examples of average cell voltage threshold widths for different program states in response to different positive biases applied to the cells.

Nevertheless, even though the Vt of the median cells may degrade at an accelerated rate in response to an applied positive bias, the average Vt distribution width may tighten and thus improve the margin between program state distributions. For instance, FIG. 8 depicts a graph 800 showing that the average cell Vt width for different program states may decrease from that of a neutral/power off state (i.e., tighten) in response to an applied positive bias. These results indicate that the median cells, or the cells occupying the majority of the Vt distribution for those states, and the lower tail cells, which occupy a minority of the Vt distribution for those states, discharge in different directions from the CTL. That is, since the median cells are understood to discharge in direction (1) towards the BLK in response to a positive bias as described above in FIGS. 6B and 7, the lower tail cells would discharge in the opposite direction (2) towards the TNL.

Figure 9:
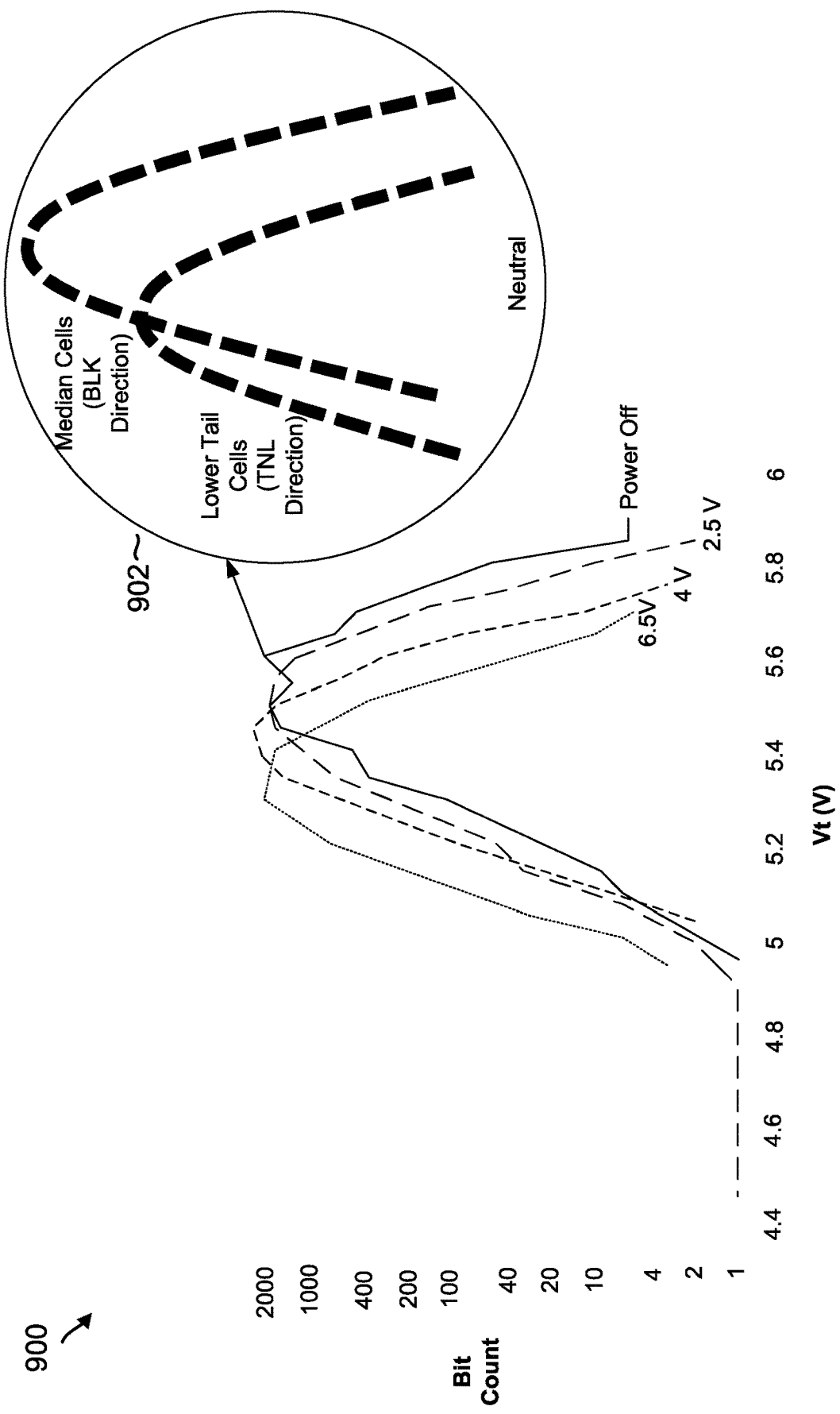
FIG. 9 is a graphical diagram illustrating examples of cell voltage threshold distributions for different positive biases applied to the cells.

FIG. 9 depicts a graph 900 showing an example of Vt distributions for cells in a given program state in response to different bias conditions. Each Vt distribution for a given bias condition may be considered to have multiple component distributions, such as illustrated at 902. For instance, FIG. 9 illustrates two component distributions of neutral state Vts, one including the Vts of median cells that discharge in the BLK direction (1), and another including the Vts of lower tail cells which discharge in the TNL direction (2). These distributions may shift differently depending on whether a positive or negative bias is applied, such as illustrated in FIGS. 10 and 11, respectively.

Figure 10:
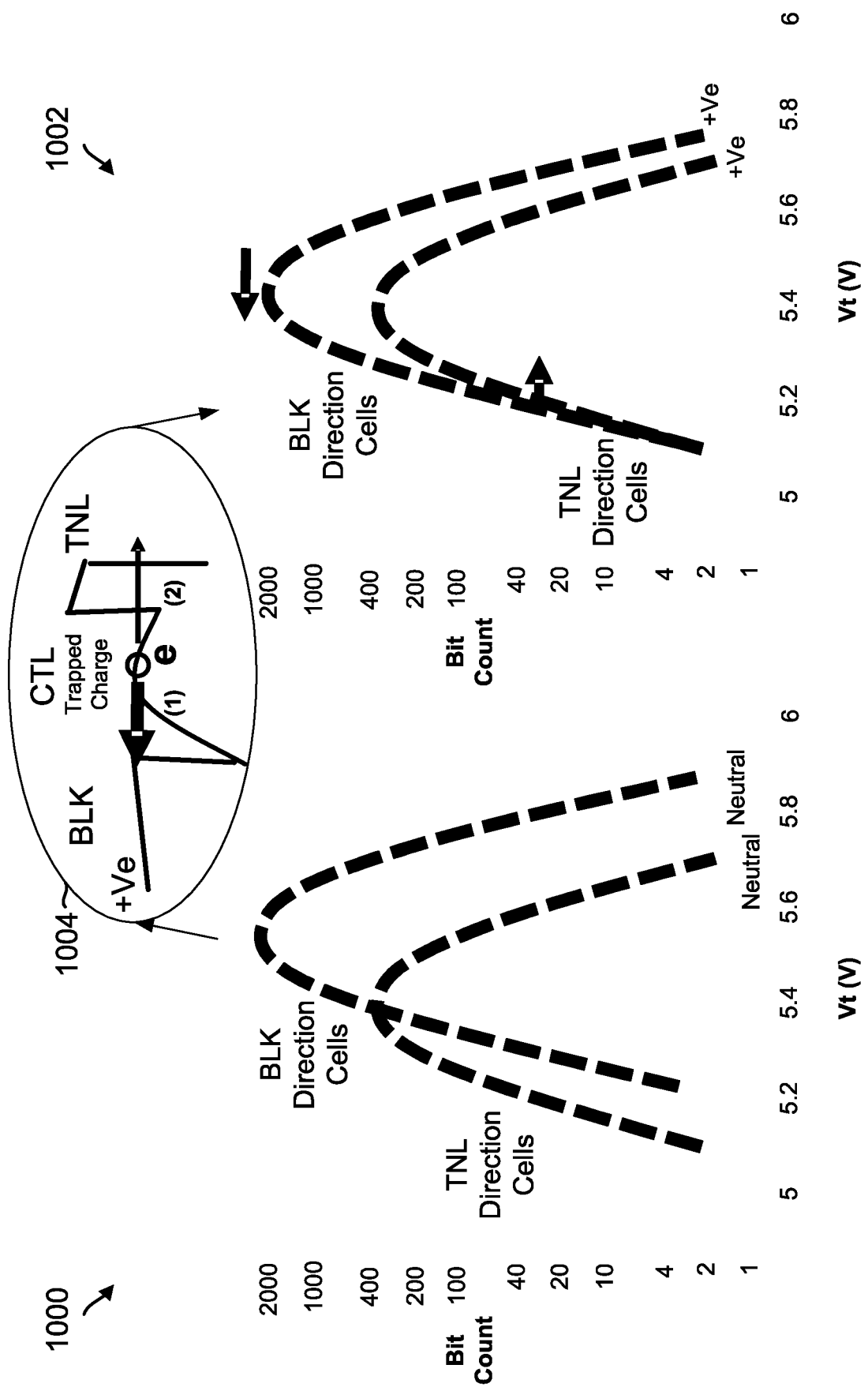
FIG. 10 is a graphical diagram illustrating an example of a median and lower tail shift in the cell voltage distribution of FIG. 9 in response to a positive bias applied to the cells.
Figure 11:
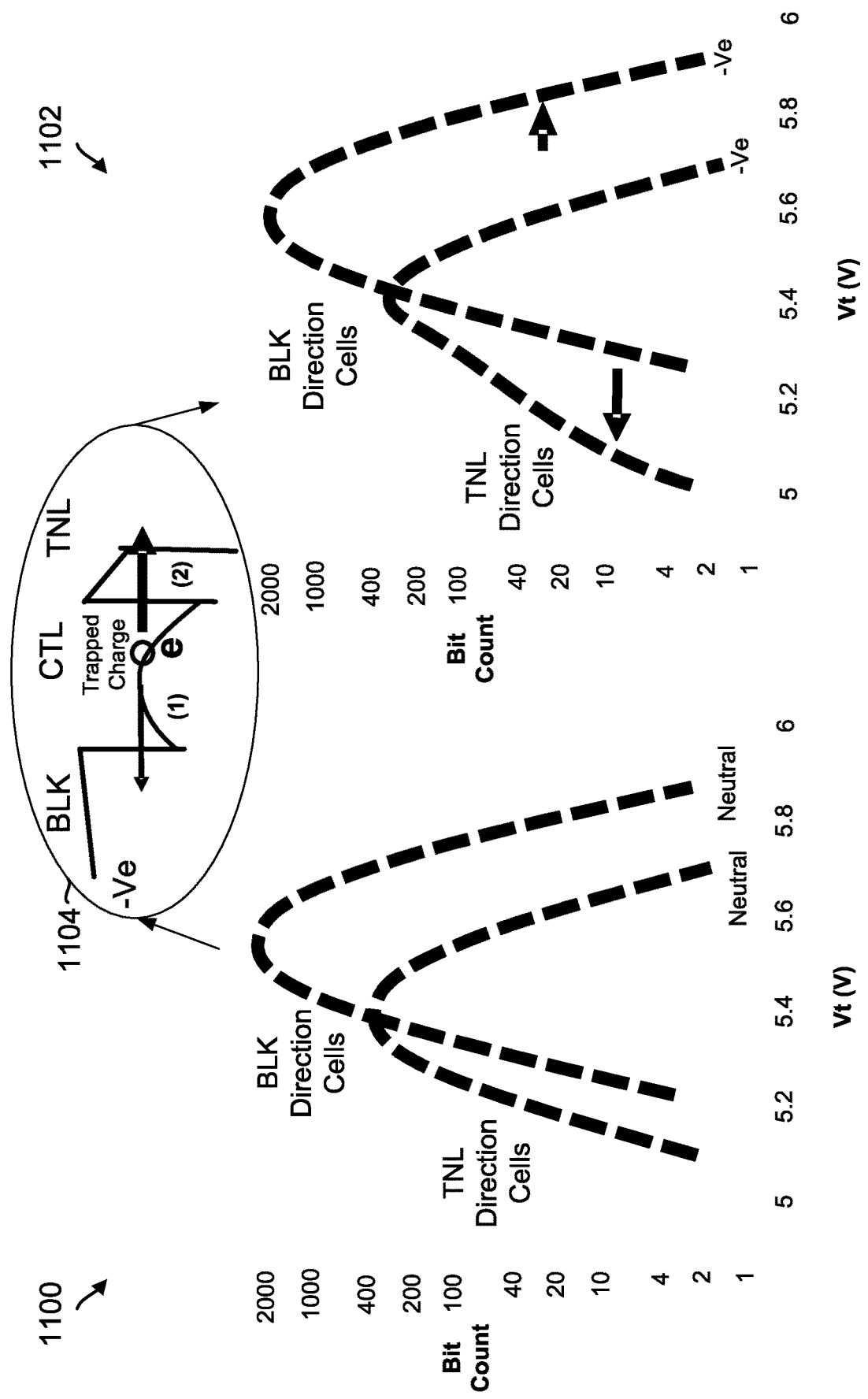
FIG. 11 is a graphical diagram illustrating an example of a median and lower tail shift in the cell voltage distribution of FIG. 9 in response to a negative bias applied to the cells.

For instance, FIG. 10 illustrates examples of graphs 1000, 1002 showing a change in the component Vt distributions of the power off curve of FIG. 9 in response to an applied positive bias Ve, as illustrated at 1004 and similarly in FIG. 6B. Here, when a positive bias is applied to the cells, the Vts of the BLK direction cells may decrease (i.e., shift left on the graph 1002 with respect to graph 1000) while the Vt of the TNL direction cells may slightly increase (i.e., shift right on the graph 1002 with respect to graph 1000). Moreover, FIG. 11 illustrates examples of graphs 1100, 1102 showing a change in the component Vt distributions of the power off curve of FIG. 9 in response to an applied negative bias −Ve, as illustrated at 1104 and similarly in FIG. 6C. Here, when a negative bias is applied to the cells, the Vt of the BLK direction cells may increase (i.e., shift right on the graph 1102 with respect to graph 1100) while the Vt of the TNL direction cells may slightly decrease (i.e., shift left on the graph 1102 with respect to graph 1100).

Figure 12:
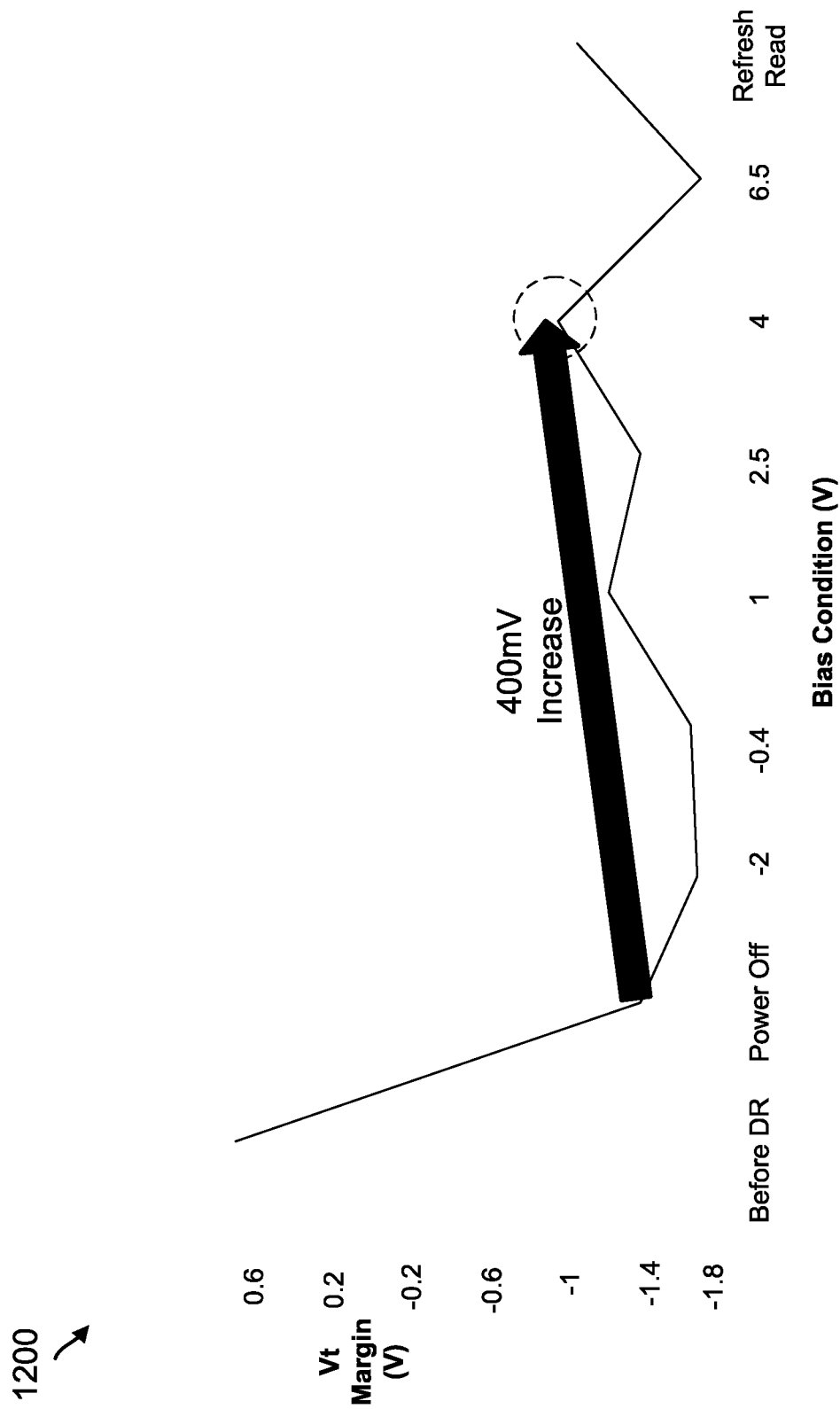
FIG. 12 is a graphical diagram illustrating examples of changes in cell voltage threshold margins in response to different positive, negative and neutral biases applied to the cells.

Thus, in contrast to negative biasing, positive biasing may tighten the Vt distribution width of a given program state, leading to improved Vt margin between different program state distributions. For instance, FIG. 12 illustrates an example 1200 showing a change in Vt margin for different positive bias conditions, where an optimum margin of ~400 mV may be gained in response to application of a constant, 4 V positive bias to the cells. Thus, applying a constant 4 V bias to the cells 116, 302 coupled to word lines 304, 408 in blocks 402 may cause the gap between Vt distributions for each of the program states 504 in FIG. 5 to widen by ~400 mV, resulting in less likelihood of Vt overlap between states.

Figure 13:
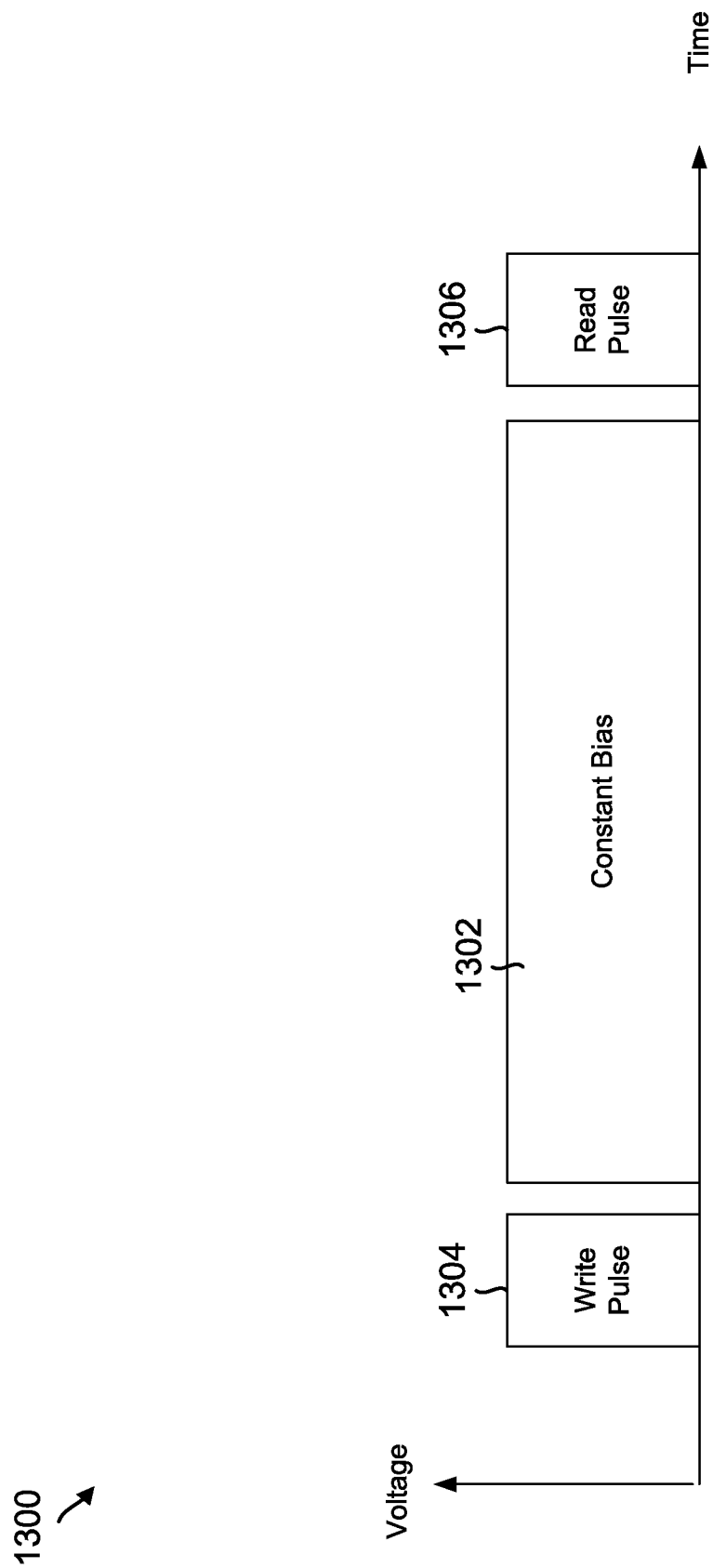
FIG. 13 is a graphical diagram illustrating an example of constant bias timing.

FIG. 13 depicts an example 1300 of a timing diagram for constant biasing which the controller 123 may apply to word lines 304, 408 between execution of host commands. When the controller 123 is not executing a host command, the controller may apply a constant bias 1302 to the word lines to maintain the charge and thus the DR of the cells coupled to those word lines and minimize subsequent read errors. For example, after applying a program voltage or write pulse 1304 to the word line in response to a write command, the controller may constantly apply a voltage (e.g., apply constant bias 1302) to maintain the cell charge until the controller subsequently applies a read voltage or read pulse 1306 to the word line in response to a read command. As a result of this constant application of a positive bias, an improved Vt margin such as shown in FIG. 12 may result (e.g., −400 mV with respect to a power off state), thus resulting in less likelihood of Vt overlap between states.

However, applying constant bias 1302 unconditionally may utilize significant power. For instance, if the controller 123 applies constant bias 1302 to multiple word lines 304, 408 in multiple blocks 402 between host commands, the storage device 102 may experience current for a significant length of time, inefficiently wasting power of the storage device. Accordingly, to save system power, the controller 123 may limit application of constant bias 1302 to the blocks 402 where DR or reliability may be a priority, such as blocks of fuse ROM 117 storing system information 121 or blocks exceeding an age threshold (e.g., 1K or other number of P/E cycles).

In one example, the controller 123 may apply the constant bias 1302 to word lines only in block(s) of fuse ROM 117, and the controller may not apply the constant bias 1302 to the word lines in blocks of other memory locations 112 in the NVM 110 (e.g., in flash memory). In another example, the controller 123 may apply the constant bias 1302 not only to word lines 304, 408 in the block(s) 402 of fuse ROM 117, but also to word lines 304, 408 in the aged or cycled blocks of the other memory locations 112 in the NVM 110. For instance, the controller 123 may constantly bias the word lines in blocks having a number of P/E cycles exceeding a given age threshold (e.g., 1K or some other number), while refraining from constantly biasing the word lines in blocks having a number of P/E cycles less than the given age threshold. The constant bias 1302 applied to the block(s) 402 in this case may depend on the number of P/E cycles associated with those block(s). For instance, the controller 123 may apply different constant biases to blocks 402 having different amounts of P/E cycles. The controller 123 may also drive or float the constant biases to the fuse ROM 117 or to the other memory locations using a charging circuit, such as illustrated and described below with respect to FIG. 14.

FIG. 14 illustrates an example 1400 of a controller 1402 which performs constant biasing in an NVM 1404. The NVM 1404 includes an OTP memory 1406 and a flash memory 1408. The OTP memory 1406 includes an OTP block 1410, and OTP block 1410 includes cells coupled to OTP word lines 1412. The flash memory 1408 includes flash blocks 1414, and each of the flash blocks 1414 includes cells coupled to flash word lines 1416. The controller 1402 receives host commands 1418 from a host 1420, such as read and write commands, and executes the commands in the NVM 1404. For example, the controller 1402 may read or write data in the flash blocks 1414 in response to one of the host commands 1418, e.g., by providing a flash memory address associated with one of the flash blocks to a row decoder 1422, which in turn selects one of the flash word lines 1416 associated with that address to be applied a read or program voltage. Similarly, the controller may read data in the OTP block 1410, e.g., by providing an OTP memory address associated with one of the OTP blocks to a row decoder 1424, which in turn selects one of the OTP word lines associated with that address to be applied a read voltage. Controller 1402 may correspond to controller 123 of FIG. 1, host 1420 may correspond to host 104 of FIG. 1, NVM 1404 may correspond to NVM 110 of FIG. 1, OTP memory 1406 may correspond for example to fuse ROM 117 in FIG. 1, flash memory 1408 may for example include the memory locations 112 of FIG. 1, OTP blocks 1410 and flash blocks 1414 may correspond to blocks 402 of FIG. 4, and OTP word lines 1412 and flash word lines 1416 may correspond to word lines 304, 408 of FIGS. 3 and 4.

In one example, the controller 1402 may apply a constant bias to word lines 1412 of the OTP block 1410. For example, the controller may apply a driven bias 1426 to one or more of the word lines 1412 of the OTP block 1410, a floating bias 1428 to one or more of the word lines 1412 of the OTP block 1410, or a combination of driven and floating biases to different ones of the word lines of the OTP block. The biases may be constant in that they may be continuously applied to each word line between execution of host commands, for example, while the controller 1402 is not applying a read voltage on a respective word line in response to one of the host commands 1418.

To provide constant biasing in the OTP block 1410, the NVM 1404 may include an OTP charging circuit 1430 which is configured to drive or float a bias 1432 selected by the controller 1402 to one or more of the word lines 1412. For example, the OTP charging circuit 1430 may include a charge pump 1434 including one or more diodes, capacitors, transistors, or other electrical components that are configured to maintain or increase the bias 1432 selected by the controller, along with electrical connectors (e.g., wires or other conductors) which connect and carry the voltage output by the charge pump to each of the word lines 1412 of the OTP block. The charge pump 1434 may also be configured to drive the voltage applied by the controller to an optimum level for Vt margin improvement (e.g., 4 V as described above with respect to FIG. 12, or some other value). The OTP charging circuit 1430 may further include one or more switches 1436 (e.g., transistors or other components) that are each coupled to one or more of the word lines 1412, and the controller may control the one or more switches 1436 to create floating bias 1428. For example, after driving the bias 1432 applied by the controller through the charge pump 1434 to an optimum level (e.g., 4 V or some other value), the controller may open one or more of the switches 1436 (e.g., via an OTP bias switch control voltage such as illustrated in FIG. 14) to interrupt the flow of current from the charge pump 1434 and thereby float the previously driven bias. Moreover, after floating the bias for a configured period of time, the controller may close the one or more of the switches 1436 (e.g., via the OTP bias switch control voltage or in some other manner) to "un-float" the bias and re-charge the cells on the word lines 1412, thus compensating for any leakage current that may reduce the floating bias 1428 over time. The configured period of time during which the bias may remain floating, or the amount of time during which the bias may remain un-floating (recharging), may be depend on a page size for the OTP block 1410 (e.g., the number of cells coupled to the word line 1412). For instance, if the controller determines the page size to be 8K, the controller may wait one length of time before closing the switches 1436 to re-charge the cells (or keep the switches closed that length of time), while if the controller determines that the page size is 16K, the controller may wait another, longer length of time before closing the switches 1436 to recharge the cells (or keep the switches closed that other length of time). The controller may thus periodically open and close the switches 1436 and repeat the floating and un-floating of a bias applied to the word line(s) 1412 of OTP blocks 1410 to compensate for leakage current based on word line length.

In another example, the controller 1402 may apply a constant bias to word lines 1416 of one or more of the flash blocks 1414. For example, the controller may apply a driven bias 1438 to one or more of the word lines 1416 of the flash block 1414, a floating bias 1440 to one or more of the word lines 1416 of the flash block 1410, or a combination of driven and floating biases to different ones of the word lines of the flash block. The biases may be constant in that they may be continuously applied to each word line between execution of host commands, for example, while the controller 1402 is not applying a program voltage or read voltage on a respective word line in response to one of the host commands 1418. The constant bias applied to the flash blocks may be the same as, or different from, the constant bias applied to the OTP blocks.

To provide constant biasing in one or more of the flash blocks 1414, the NVM 1404 may include a flash charging circuit 1442 which is configured to drive or float the bias 1432 selected by the controller 1402 to one or more of the word lines 1416. For example, the flash charging circuit 1442 may include a charge pump 1444 including one or more diodes, capacitors, transistors, or other electrical components that are configured to maintain or increase the bias 1432 selected by the controller, along with electrical connectors (e.g., wires or other conductors) which connect and carry the voltage output by the charge pump to each of the word lines 1416 of the flash block. The charge pump 1444 may also be configured to drive the voltage applied by the controller to an optimum level for Vt margin improvement (e.g., 4 V as described above with respect to FIG. 12, or some other value), to a same voltage as that output by charge pump 1434, or to a different voltage than that output by charge pump 1434. The flash charging circuit 1442 may further include one or more switches 1446 (e.g., transistors or other components) that are each coupled to one or more of the word lines 1416, and the controller may control the one or more switches 1446 to create floating bias 1440. For example, after driving the bias 1432 applied by the controller through the charge pump 1444 to a configured voltage (e.g., 4 V or some other value), the controller may open one or more of the switches 1446 (e.g., via a flash bias switch control voltage such as illustrated in FIG. 14, or in some other manner) to interrupt the flow of current from the charge pump 1444 and thereby float the previously driven bias. Moreover, after floating the bias for a configured period of time, the controller may close the one or more of the switches 1446 (e.g., via the flash bias switch control voltage or in some other manner) to "un-float" the bias and re-charge the cells on the word lines 1416, thus compensating for any leakage current that may reduce the floating bias 1440 over time. The configured period of time during which the bias may remain floating, or the amount of time during which the bias may remain un-floating (recharging), may be depend on a page size for the flash block 1414 (e.g., the number of cells coupled to the word line 1416). For instance, if the controller determines the page size to be 8K, the controller may wait one length of time before closing the switches 1446 to re-charge the cells (or keep the switches closed that length of time), while if the controller determines that the page size is 16K, the controller may wait another, longer length of time before closing the switches 1446 to recharge the cells (or keep the switches closed that other length of time). The controller may thus periodically open and close the switches 1446 and repeat the floating and un-floating of a bias applied to the word line(s) 1416 of flash blocks 1414 to compensate for leakage current based on word line length.

Moreover, to condition constant biasing in cycled flash blocks as opposed to fresh flash blocks, the flash charging circuit 1442 may include a switch 1448 (e.g., one or more transistors or other components) connected to the charge pump 1444 which the controller may control based on an age of the flash block 1414. In particular, the controller may enable or disable constant biasing for a flash block (e.g., using the switch 1448 or in some other manner) based on a number of P/E cycles 1450 which the controller may track for each of the flash blocks 1414. For example, the controller may determine at 1452 whether the number of P/E cycles of a flash block to include biasing meets or exceeds an age threshold 1454 (e.g., 1K P/E cycles or some other number). If the controller determines at 1452 that the number of P/E cycles is less than the age threshold 1454 (e.g., the block has less than 1K cycles), the controller may refrain from performing constant biasing in that flash block, e.g., by turning off the switch 1448 in response to a bias disable signal output by the controller and preventing the bias 1432 from passing to the charge pump 1444. Alternatively, if the controller determines at 1452 that the number of P/E cycles is greater than or equal to the age threshold 1454 (e.g., the block has at least 1K cycles), the controller may perform constant biasing in that flash block, e.g., by turning on the switch 1448 in response to a bias enable signal output by the controller such that the bias 1432 may pass to the charge pump 1444 to be maintained (or increased) for application to the word lines 1416.

Additionally, when the controller performs constant biasing of a cycled flash block, the bias 1432 applied by the controller 1402 may change over time depending on the number of P/E cycles 1450 for that flash block. For example, if the controller 1402 determines one of the flash blocks 1414 to have one number of P/E cycles (e.g., 1K), the controller (or a bias selector module of the controller) may select one constant bias to be applied to the word lines of that block (e.g., 4 V or some other voltage). If the controller later determines that flash block to have a different number of P/E cycles (e.g., 2K), the controller (or a bias selector module of the controller) may apply a different or larger constant bias to the word lines of that block (e.g., 4.25 V or some other voltage). The controller may also apply different biases simultaneously in different blocks based on the number of P/E cycles of each block. For instance, if the controller 1402 determines that one of the flash blocks 1414 to include constant biasing has 1K P/E cycles and another one of the flash blocks 1414 to include constant biasing has 2K P/E cycles, the controller may select a different bias (e.g., via the bias selector module) to be correspondingly applied to the word lines in the different flash blocks. For instance, the controller may apply a driven or floating bias of 4 V to the word lines 1416 of the flash block having 1K P/E cycles, and a driven or floating bias of 4.25 V to the word lines 1416 of the flash block having 2K P/E cycles. The bias selector module may be implemented, for instance, with a voltage source controlled to output different voltages based on software mapping different numbers of P/E cycles to different biases, or in some other manner in hardware, software, or a combination of hardware and software.

The charging circuits 1430, 1442 illustrated in FIG. 14 are merely examples showing possible inputs, outputs, electrical components, and arrangement of components that the NVM 1404 may include to enable the controller 1402 to constantly apply bias 1432 (e.g., driven bias 1426, 1438 or floating bias 1428, 1440) to respective ones of the word lines 1412, 1416. However, the charging circuits 1430, 1442 may be configured differently in other examples. For example, charge pumps 1434, 1444 may either or both be replaced with a voltage source that directly supplies the bias 1432 to the word lines as driven bias 1426, 1438, the switches 1436, 1446 may be replaced by other electrical components or controlled by other inputs or controller outputs which enable floating of the driven bias as floating bias 1428, 1440, switch 1448 may be replaced by other electrical component(s) or controlled by other input(s) or controller output(s) which enable or disable constant biasing based on number of P/E cycles, etc. In another example, charging circuit 1430, 1442 may either or both be divided into multiple charging circuits (e.g., one charging circuit per word line or multiple word lines), or charging circuits 1430, 1442 may be combined into a single charging circuit. Thus, the illustrated circuits in the present disclosure are not intended to be limiting, and other circuits may be considered which allow the controller 1402 to perform constant biasing in OTP memory and flash memory between execution of host commands 1418.

Figure 15:
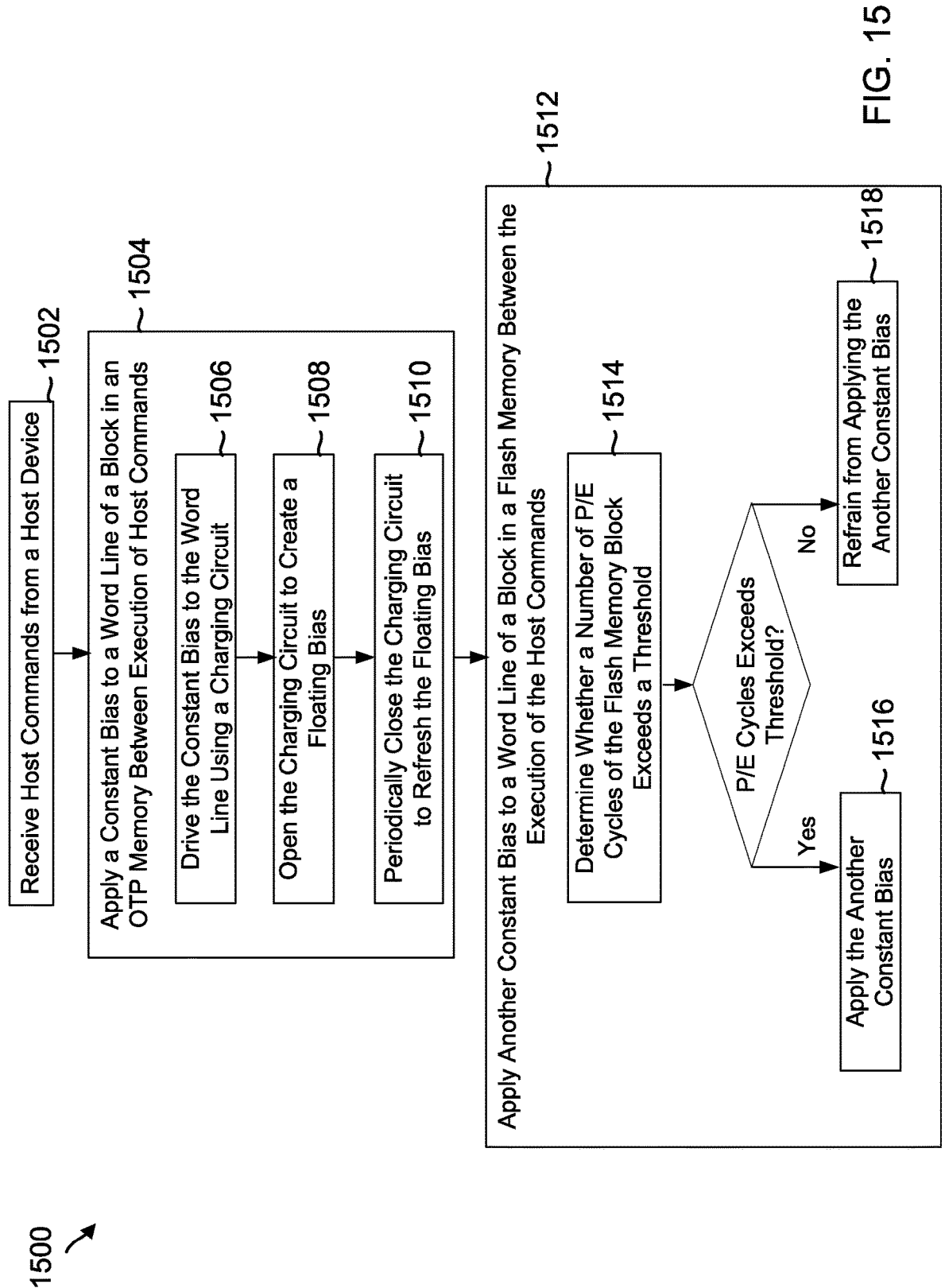
FIG. 15 is a flow chart illustrating an example of a method for performing constant biasing, as performed by the storage device of FIG. 1.

FIG. 15 illustrates an example flow chart 1500 of a method for performing constant biasing. For example, the method can be carried out in a storage device 102 such as the one illustrated in FIG. 1. Each of the steps in the flow chart can be controlled using the controller as described below (e.g. controller 123, 1402), by a component or module of the controller, or by some other suitable means.

As represented by block 1502, the controller may receive host commands from a host device. For example, referring to the aforementioned figures, the controller 1402 may receive host commands 1418 from host 1420.

As represented by block 1504, the controller may apply a constant bias to a word line of a block in an OTP memory between execution of host commands. For example, referring to the aforementioned figures, the controller 1402 may apply bias 1432 to word line(s) 1412 of OTP block 1410 in OTP memory 1406 between execution of host commands 1418. For instance, as represented by block 1506, the controller may drive the constant bias to the word line using a charging circuit. For example, referring to the aforementioned figures, the NVM 1404 may include OTP charging circuit 1430 with which controller 1402 may drive the bias 1432 to the word line(s) 1412 of OTP block 1410 (as driven bias 1426). Moreover, as represented by block 1508, the controller may open the charging circuit to create a floating bias. For example, referring to the aforementioned figures, the OTP charging circuit 1430 may include switches 1436 which the controller 1402 may open to float the bias 1432 (as floating bias 1428). Additionally, as represented by block 1510, the controller may periodically close the charging circuit to refresh the floating bias. For example, referring to the aforementioned figures, the controller may periodically close the switches 1436 in OTP charging circuit 1430 to refresh floating bias 1428.

As represented by block 1512, the controller may apply another constant bias to a word line of a block in a flash memory between the execution of host commands. For example, referring to the aforementioned figures, the controller 1402 may apply bias 1432 to word line(s) 1416 of flash block 1414 in flash memory 1408 between execution of host commands 1418. The controller may apply the another constant bias to cycled blocks, but not to fresh blocks. For instance, as represented by block 1514, the controller may determine whether a number of P/E cycles of the flash memory block exceeds a threshold. For example, referring to the figures, the controller 1402 may determine at 1452 whether a number of P/E cycles 1460 of the flash block 1414 exceeds an age threshold 1454. If the number of P/E cycles exceeds the threshold, then as represented by block 1516, the controller may apply the another constant bias. For example, referring to the figures, the NVM 1404 may include flash charging circuit 1442 with which controller 1402 may drive the bias 1432 to the word line(s) 1416 of flash block 1414 (as driven bias 1438). Moreover, the flash charging circuit 1442 may include switches 1446 which the controller may open to float the bias 1432 (as floating bias 1440). Additionally, the controller may periodically close the switches 1446 in flash charging circuit 1442 to refresh floating bias 1440. On the other hand, if the number of P/E cycles does not exceed the threshold, then as represented by block 1518, the controller may refrain from applying the another constant bias. For example, referring to the figures, the flash charging circuit 1442 may include switch 1448 which the controller 1402 may open to disable the constant biasing.

Figure 16:
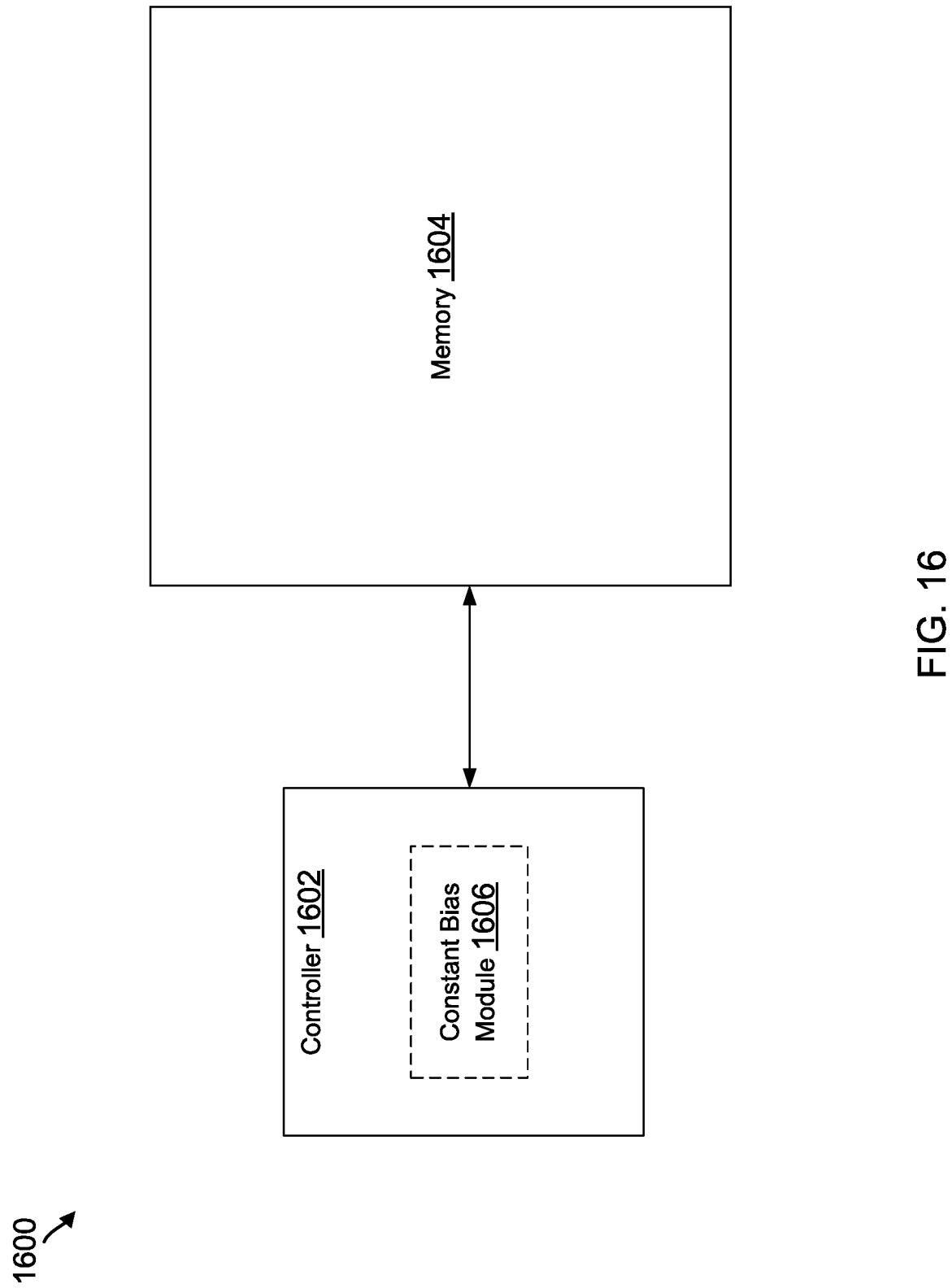
FIG. 16 is a conceptual diagram illustrating an example of a controller that performs constant biasing in the storage device of FIG. 1.

FIG. 16 is a conceptual diagram illustrating an example 1600 of a controller 1602 coupled to a memory 1604 in a storage device. For example, controller 1602 may correspond to controller 123, 1402 and memory 1604 may correspond to the NVM 110, 1404 of the storage device 102 in FIGS. 1 and 14. The controller may be implemented in software, hardware, or a combination of hardware and software. In one exemplary embodiment, the controller is implemented with several software modules executed on one or more processors, but as those skilled in the art will appreciate, the controller may be implemented in different ways. The skilled artisan will readily understand how best to implement the controller based on the particular design parameters of the system.

In one example, the controller 1602 includes a constant bias module 1606 that may provide a means for applying a constant bias to a word line between execution of host commands. For example, the constant bias module 1606 may perform the process or algorithm described above with respect to FIGS. 14 and 15.

Thus, the controller of the present disclosure may save system power while maintaining or improving DR by applying constant biasing between host commands to priority blocks where data reliability may be significant, such as OTP memory blocks (e.g., fuse ROM blocks) and cycled flash memory blocks, while refraining from applying constant biasing to other blocks (e.g., fresh flash memory blocks). Moreover, the controller may apply different constant biases to flash memory blocks based on a number of P/E cycles of the block, thereby providing corresponding Vt margin improvements to compensate for the respective charge loss in each block. Furthermore, a balance in DR improvement and system power savings may be achieved in the design of charging circuit(s) that allow the controller to apply constant biasing through either active, driven biases or passive, floating biases (or both).

The various aspects of this disclosure are provided to enable one of ordinary skill in the art to practice the present invention. Various modifications to exemplary embodiments presented throughout this disclosure will be readily apparent to those skilled in the art, and the concepts disclosed herein may be extended to other magnetic storage devices. Thus, the claims are not intended to be limited to the various aspects of this disclosure, but are to be accorded the full scope consistent with the language of the claims. All structural and functional equivalents to the various components of the exemplary embodiments described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) in the United States, or an analogous statute or rule of law in another jurisdiction, unless the element is expressly recited using the phrase "means for" or, in the case of a method claim, the element is recited using the phrase "step for."

What is claimed is:

1. A storage device, comprising:
   a flash memory including a block, the block having a word line and a plurality of cells coupled to the word line; and
   a controller configured to apply a constant bias to the word line between execution of host commands in response to a number of program/erase (P/E) cycles of the block being greater than or equal to a threshold.

2. The storage device of claim 1, wherein the controller is configured to apply the constant bias to the word line following execution of a write command until execution of a read command.

3. The storage device of claim 1, further comprising:
   a one-time programmable (OTP) memory including a second block, the second block having a second word line and a plurality of cells coupled to the second word line;
   wherein the controller is configured to apply another constant bias to the second word line between the execution of the host commands.

4. The storage device of claim 1, wherein the controller is configured to determine whether the number of P/E cycles of the block exceeds the threshold.

5. The storage device of claim 4, wherein the controller is configured to apply the constant bias to the word line in response to determining that the number of P/E cycles exceeds the threshold.

6. The storage device of claim 4, wherein the block includes a second word line, and wherein the controller is configured to refrain from applying another constant bias to the second word line in response to determining that the number of P/E cycles does not exceed the threshold.

7. The storage device of claim 1, wherein the constant bias is a function of the number of P/E cycles of the block.

8. The storage device of claim 1, wherein the constant bias comprises a driven bias.

9. The storage device of claim 1, wherein the constant bias comprises a floating bias.

10. The storage device of claim 9, wherein the controller is configured to periodically refresh the floating bias.

11. A storage device, comprising:
    a fuse read only memory (ROM) including a block, the block having a word line and a plurality of cells coupled to the word line; and
    a controller configured to receive host commands from a host device, and to apply a constant floating bias to the word line between execution of the host commands.

12. The storage device of claim 11, wherein the fuse ROM stores system information.

13. The storage device of claim 11, further comprising:
    a flash memory including a second block, the second block including a second word line and a plurality of cells coupled to the second word line;
    wherein the controller is configured to determine whether a number of program/erase (P/E) cycles of the second block exceeds a threshold, and to apply another constant bias to the second word line between the execution of the host commands in response to determining that the number of PIE cycles of the second block exceeds the threshold.

14. The storage device of claim 11, further comprising:
    a charging circuit, wherein the controller is configured to apply a driven bias to the word line using the charging circuit.

15. The storage device of claim 14, wherein the controller is configured to open the charging circuit to create a floating bias before applying the constant floating bias between the execution of the host commands.

16. The storage device of claim 15, wherein the controller is configured to periodically close the charging circuit to refresh the floating bias after applying the constant floating bias between the execution of the host commands.

17. A storage device, comprising:
- a one-time programmable (OTP) memory including a first block, the first block having a first word line and a plurality of cells coupled to the first word line;
- a flash memory including a second block, the second block having a second word line and a plurality of cells coupled to the second word line; and
- a controller configured to apply a first constant bias to the first word line and a second constant floating bias to the second word line between execution of host commands.

18. The storage device of claim 17, wherein when applying the first constant bias to the first word line, the controller is configured to drive the first constant bias to the first word line using a charge pump.

19. The storage device of claim 18, wherein the controller is configured, after charging of the cells coupled to the first word line, to float the first constant bias.

20. The storage device of claim 19, wherein the controller is configured to drive the first constant bias to the first word line a period of time after floating the first constant bias.

* * * * *